United States Patent [19]
Sung

[11] Patent Number: 5,858,831
[45] Date of Patent: Jan. 12, 1999

[54] PROCESS FOR FABRICATING A HIGH PERFORMANCE LOGIC AND EMBEDDED DRAM DEVICES ON A SINGLE SEMICONDUCTOR CHIP

[75] Inventor: Janmye Sung, Yang-Mei, Taiwan

[73] Assignee: Vanguard International Semiconductor Corporation, Hsin-Chu, Taiwan

[21] Appl. No.: 31,683

[22] Filed: Feb. 27, 1998

[51] Int. Cl.$^6$ .................. H01L 21/8242; H01L 21/20
[52] U.S. Cl. ............................... 438/241; 438/396
[58] Field of Search .................. 438/241, 396, 438/210, 303, 275, 152

[56] References Cited

U.S. PATENT DOCUMENTS

| | | | |
|---|---|---|---|
| 5,260,226 | 11/1993 | Sawanda et al. | 438/210 |
| 5,292,677 | 3/1994 | Dennison | 438/396 |
| 5,296,402 | 3/1994 | Ryou | 438/152 |
| 5,371,026 | 12/1994 | Hayden et al. | 438/275 |
| 5,395,784 | 3/1995 | Lu et al. | 437/52 |
| 5,554,557 | 9/1996 | Koh | 438/396 |
| 5,612,214 | 3/1997 | Arima | 438/241 |
| 5,668,035 | 9/1997 | Fang et al. | 438/239 |
| 5,668,036 | 9/1997 | Sune | 438/253 |
| 5,716,862 | 2/1998 | Ahmad et al. | 438/303 |
| 5,750,426 | 5/1998 | Rajkanan et al. | 438/210 |
| 5,759,889 | 6/1998 | Sakao | 438/241 |

Primary Examiner—John F. Niebling
Assistant Examiner—Christopher Lattin
Attorney, Agent, or Firm—George O. Saile; Stephen B. Ackerman

[57] ABSTRACT

A process for creating a region of high performance logic devices, and a region of low cost memory devices, on a single semiconductor chip, has been developed. The process features CMOS logic devices, comprised of polycide gate structures, residing on a thin silicon dioxide gate insulator layer. An N type polysilicon layer, used as part of a polycide structure, is used with the N channel CMOS devices, while a P type polysilicon layer, is used with the P channel CMOS devices. DRAM memory devices are comprised of polycide gate structures, featuring only an N type polysilicon layer, on a silicon dioxide gate insulator layer, that is thicker than the gate silicon oxide layer used with the high performance logic devices. A minimum of additional photolithographic masking procedures is used to improve the performance of the logic region, one mask to allow specific polycide gate structures to be created with either P type or N type polysilicon, and another additional mask used to allow different gate insulator layers to be formed in each specific region. A large angle, ion implantation procedure, is used to form lightly doped source and drain regions, under the silicon nitride spacers on the sides of polycide gate structures, in both logic and DRAM memory regions.

24 Claims, 20 Drawing Sheets

PROCESS FOR FABRICATING A HIGH PERFORMANCE LOGIC AND EMBEDDED DRAM DEVICES ON A SINGLE SEMICONDUCTOR CHIP

BACKGROUND OF THE INVENTION (1) Field of the Invention

This invention relates to methods used to fabricate semiconductor devices, and more specifically a process used to fabricate high performance logic devices and low cost memory devices, on a single semiconductor chip.

(2) Description of Prior Art

The semiconductor industry is continually striving to increase device performance, while still maintaining, or even reducing the cost of these same devices. Microminiaturization or the ability to create semiconductor devices with sub-micron features, has allowed the performance, and the cost objectives, to be partially realized. The use of sub-micron features result in a decrease in performance degrading, parasitic capacitances, thus allowing performance improvements to be realized. In addition the use of sub-micron features allows smaller semiconductor chips to be created, with the smaller chips still offering device densities comparable to device densities achieved with larger chips, thus allowing a greater number of chips to be realized from a specific size starting semiconductor substrate, thus reducing processing costs.

Another direction taken by the semiconductor industry, in an attempt to reduce cost while still improving device performance, has been the integration of logic devices, and memory devices, on the same semiconductor chip. This integration improves performance by decreasing undesirable delays that occur between memory devices, located on one semiconductor chip, and logic devices, located on a different chip. In addition the processing costs for integrating memory and logic devices on the same semiconductor chip, are reduced due to the sharing of specific process steps, used to fabricate both types of devices.

Efforts have been ongoing by the semiconductor industry, in attempting to incorporate both logic and memory requirements on a single semiconductor chip. Dennison, in U.S. Pat. No. 5,292,677, describes a process for integrating complimentary metal oxide semiconductor, (CMOS), devices, with dynamic random access memory, (DRAM), devices, on a single semiconductor chip. However that invention does not share as many processing steps needed to realize significant cost reductions, nor does it offer a process needed for high performance logic devices. This invention will describe an integrated process, which features high performance CMOS devices, realized via many innovations such as the use of gate insulator layers, thinner than the gate insulator layers used for the DRAM devices. It will also feature the use of conductive silicide layers for source and drain regions of the CMOS devices, formed using a process sequence that reduces a possible bridging mechanism between gate structures and substrate. In addition this new process, for forming high performance logic, and embedded memory devices, on a single semiconductor chip, will be practiced using many process sequences, shared by both type devices, with the addition of only two photolithographic masking procedures, added to the CMOS logic process sequence, which enables improved performance of the logic region to be realized while and still achieve cost reductions.

SUMMARY OF THE INVENTION

It is an object of this invention to provide a process for fabricating high performance CMOS logic devices, and embedded DRAM memory devices, on the same semiconductor chip.

It is another object of this invention to use only one additional photolithographic masking procedure, to allow formation of a thin gate insulator layer for the high performance CMOS devices, while a thicker gate insulator layer is used for the embedded DRAM memory devices.

It is still another object of this invention to again add only one photolithographic masking procedure, to create a P type, polysilicon, for the polycide gate structure, used with the P channel CMOS devices, while creating N type, polysilicon, for the polycide gate structures, used with the N channel CMOS devices, and with the embedded DRAM memory devices.

It is still yet another object of this invention to use a process to eliminate salicide, (Self ALIgned metal siliCIDE), bridging, between gate and substrate, by a process sequence which only forms metal silicide on exposed source and drain regions.

In accordance with the present invention a fabrication process is described for integrating high performance CMOS logic devices, and embedded DRAM memory devices, on a single semiconductor chip. After formation of P well regions for both the embedded DRAM devices, and N channel CMOS devices, as well as the formation of an N well region, for the P channel CMOS devices, a deep, N type layer, is formed in the semiconductor substrate, in the DRAM region, to isolate a subsequent DRAM cell from the underlying substrate. After creation of a thin gate insulator layer, for the CMOS devices, and a thicker gate insulator layer, for the DRAM devices, an undoped polysilicon layer is deposited, followed by creation of shallow trench isolation regions, used to separate subsequent P channel and N channel CMOS devices, in the logic region of the semiconductor chip, as well as separating the memory region of embedded DRAM devices, from the high performance logic region comprised of CMOS devices. A process sequence, using only one photolithographic masking procedure is next used to N type dope the polysilicon region to be used for the DRAM devices, as well as the polysilicon region, to be used for N channel CMOS, while doping the polysilicon region used for the P channel CMOS devices, P type. Silicon nitride capped, polycide gate structures, comprised of titanium silicide on N type, or P type polysilicon, are next formed, followed by creation of silicon nitride spacers, on the sides of the polycide gate structures, only in the CMOS logic region of the semiconductor chip. An ion implantation procedure, using a large tilt angle, and low dose, is used to create N type, lightly doped source and drain regions, under silicon nitride spacers, for N channel CMOS devices, followed by a higher dose, lower tilt angle, procedure, used to create N type, heavily doped source and drain regions, for the same N channel CMOS device. A similar ion implantation sequence is used to create the P type, lightly doped source and drain, and the P type, heavily doped source and drain regions, for the P channel CMOS devices. Metal silicide is next formed on the exposed source and drain regions, in the CMOS region, of the semiconductor chip.

A silicon oxide layer is next deposited, planarized, and removed in areas between polycide gate structures, in the DRAM region. After formation of silicon nitride spacers, on the sides of the polycide gate structures in the DRAM region, ion implantation procedures are performed, using a large tilt angle implant, to create N type, lightly doped source and drain regions, again under silicon nitride spacers. Polysilicon plugs are next formed between polycide gate structures, in the DRAM region of the semiconductor chip. Another silicon oxide layer is deposited and patterned to create a storage node opening, exposing the top surface of a polysilicon plug. A stacked capacitor structure is formed in the storage node opening, in the silicon oxide layer, overlying and contacting the polysilicon plug, in the DRAM region. An insulator layer is next deposited, followed by photolithographic and dry etch procedures, used to open contact holes and via holes to the stacked capacitor, and bit line regions, in the DRAM region, as well as to the gate, and source and drain regions in the CMOS logic region. Metal deposition, followed by removal of unwanted metal, are employed to form the metal contact structures, in the contact and via holes, followed by additional metal deposition and patterning, used to create metal interconnect structures, for both the DRAM memory devices, and for the CMOS logic devices.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The fabrication process used to create high performance logic regions, and low cost memory regions, on a single semiconductor chip will now be covered in detail. The DRAM device described in this invention is comprised of N channel transfer gate transistors. If desired, this invention can be used to create DRAM device, comprised of P channel transfer gate transistors. This can be accomplished by creating an N well region, in the P type semiconductor substrate, and creating P type lightly doped, and P type heavily doped source and drain regions.

Figure 1:
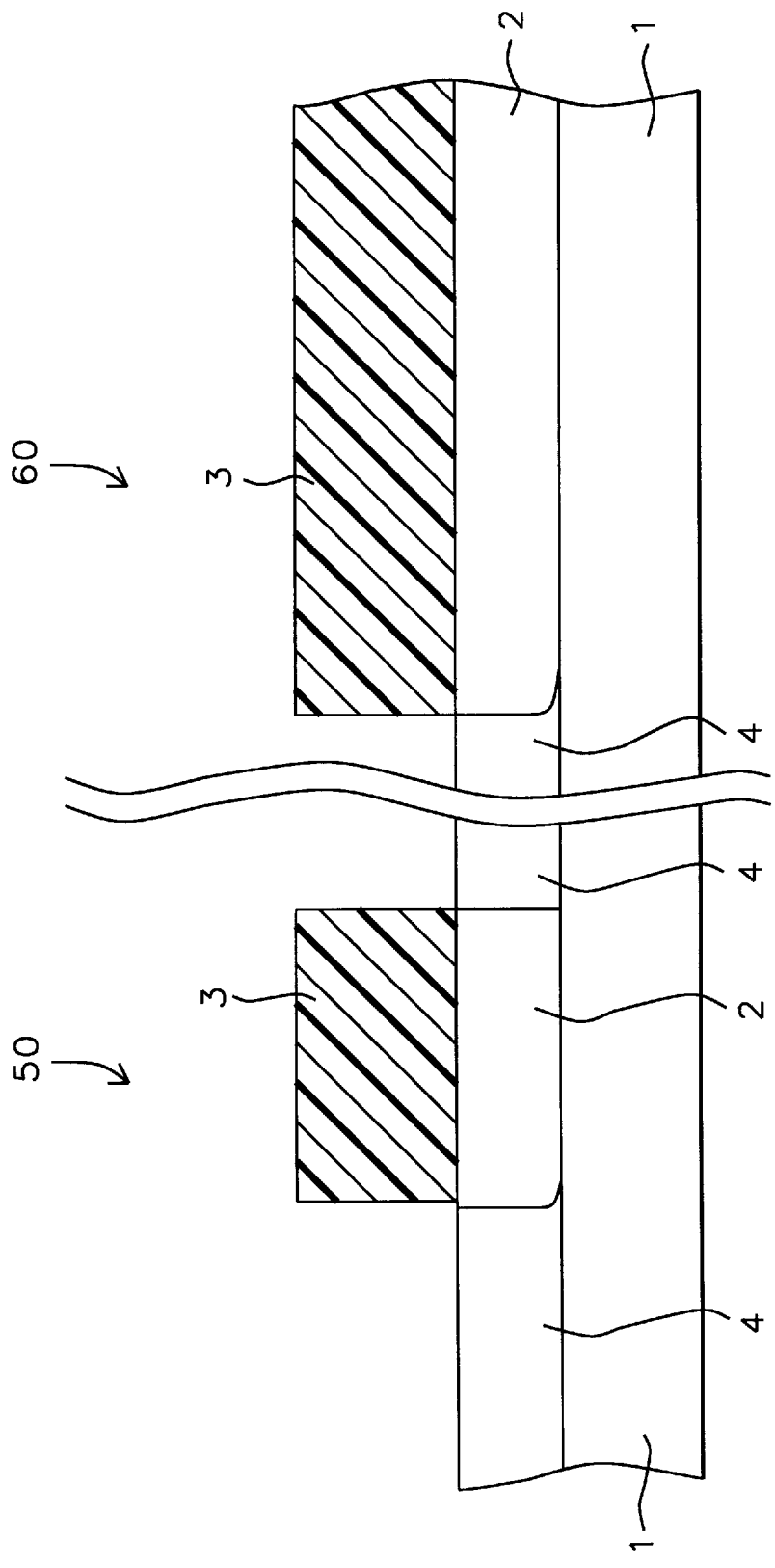
FIGS. 1–20, which schematically, in cross-sectional style, illustrates key stages of fabrication used to construct the CMOS devices, used for high performance logic, and the embedded DRAM devices, used for low cost memory, on a single semiconductor chip.

FIG. 1, shows region 50, of semiconductor substrate 1, to be used for fabrication of high performance CMOS logic devices, while region 60, of semiconductor substrate 1, will be used for embedded DRAM memory device. A P type, single crystalline silicon substrate 1, having a <100> crystallographic orientation is used. A photolithographic masking procedure, using photoresist shape 3, is used as a mask to allow N well region 4, to be formed only in openings in photoresist shape 3, in logic region 50, via ion implantation of phosphorous and arsenic. A high energy boron, ion implantation procedure, allows formation of P well regions 2, in regions of semiconductor substrate 1, underlying photoresist shape 3, in DRAM region 60, as well as in an area of logic region 50, with P well regions 2, needed for N channel CMOS devices. The high energy boron implants are located deep into semiconductor substrate 1, in regions unprotected photoresist, under N well regions 4, and do not influence device characteristics. Photoresist shape 3, is removed using plasma oxygen ashing and careful wet cleans.

Figure 2:
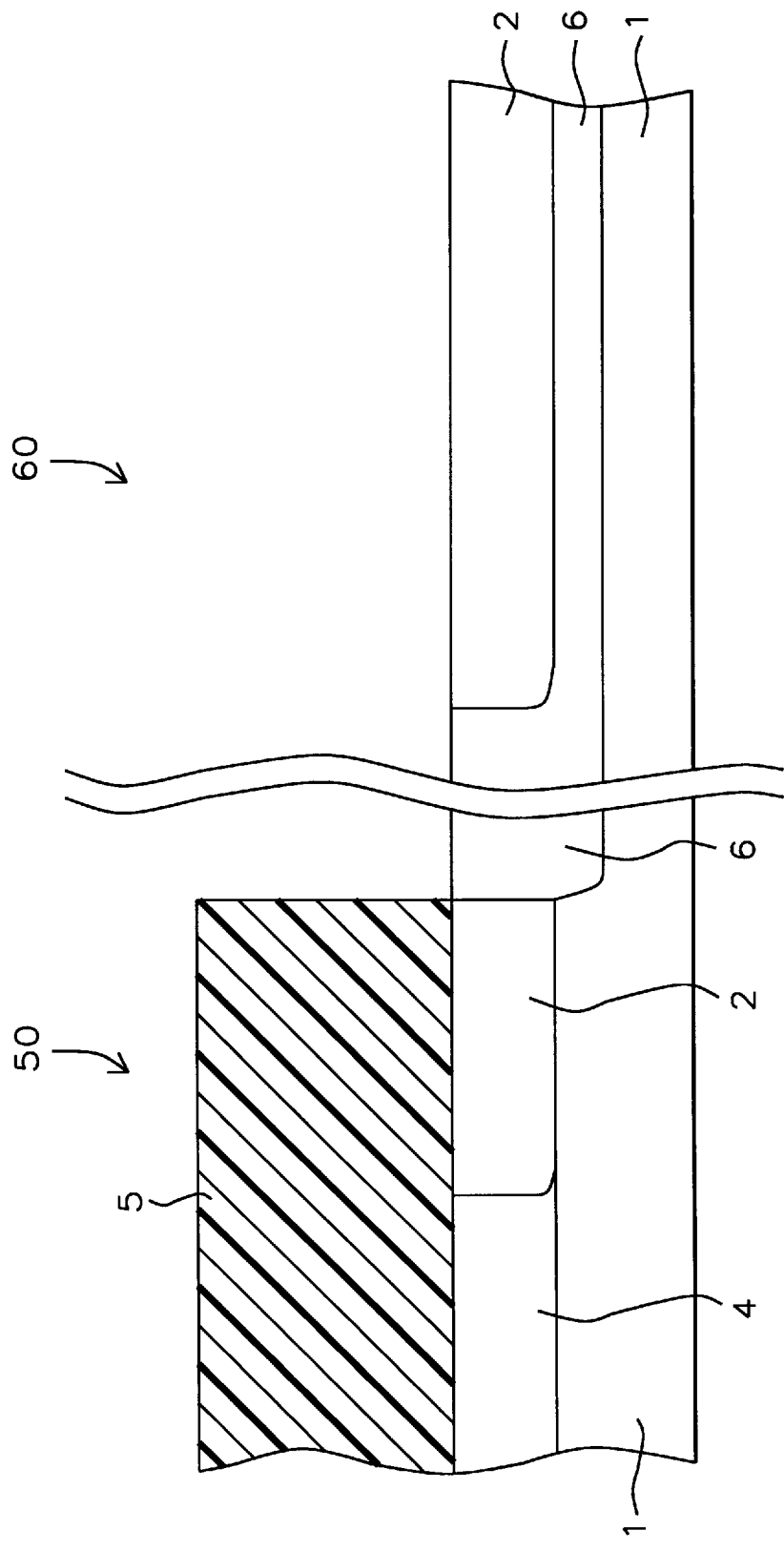

FIG. 2, shows the formation of a deep, N type region 6, used to isolate DRAM region 60, from semiconductor substrate 1. This is performed using thick photoresist shape 5, greater then 5.0 uM in thickness, protecting logic region 50, from a high energy phosphorous ion implantation procedure, performed at an energy between about 1 to 2 MeV, at a dose between about 1E12 to 1E13 atoms/cm$^2$, creating isolating deep N type region 6. In addition, a threshold adjust, ion implantation procedure, using boron, at an energy between about 1 to 10 KeV, and at a dose between about 1E11 to 1E12 atoms/cm$^2$, is used to alter the channel doping characteristics near the surface of semiconductor substrate 1, in DRAM region 60. The threshold adjust region, created in DRAM region 60, is not shown in the drawings, but is used to create DRAM devices with higher threshold voltages than the N channel CMOS devices that will be subsequently created in logic region 50.

Figure 3:
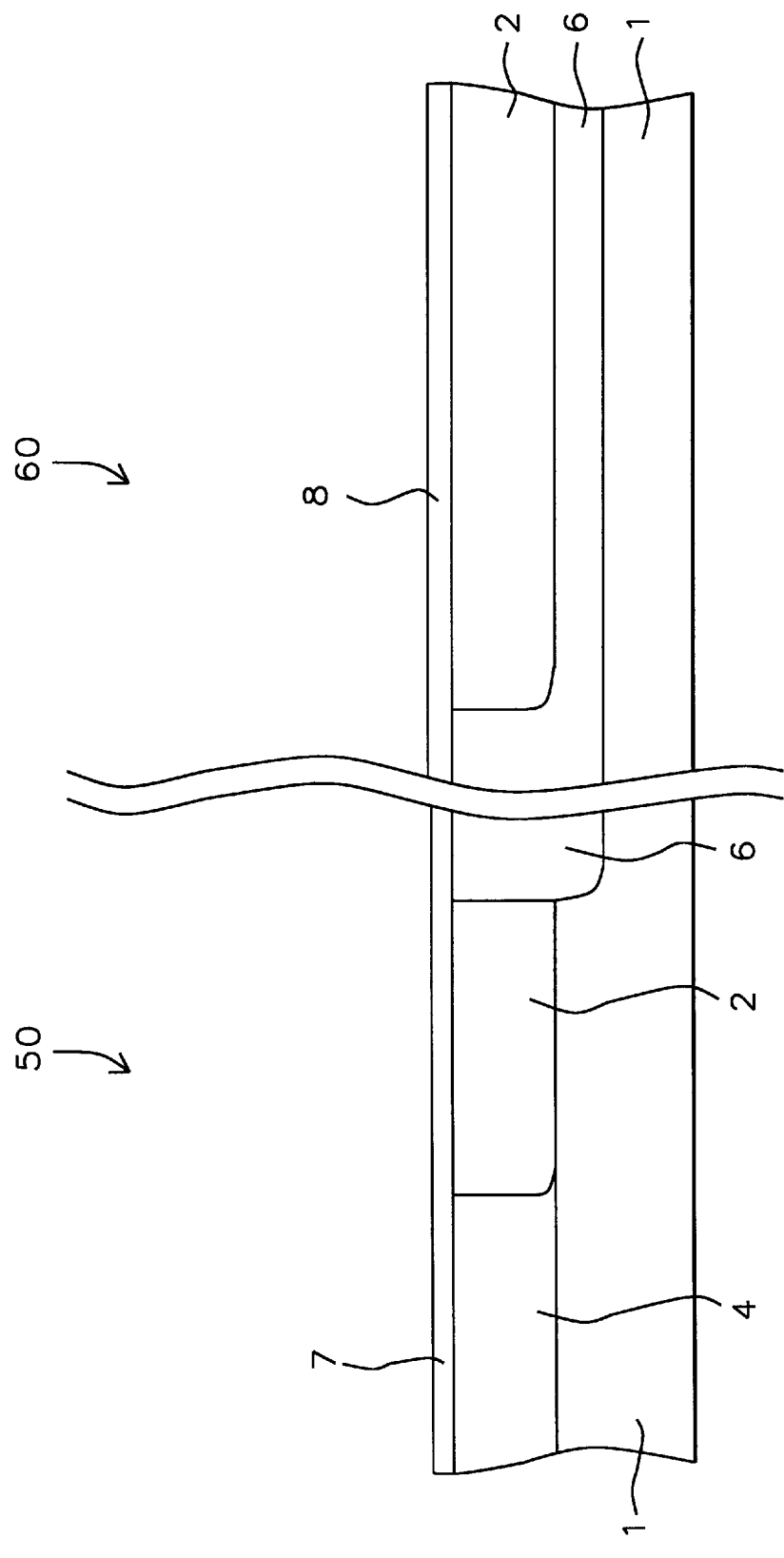

After removal of thick photoresist shape 5, via plasma oxygen ashing and careful wet cleans, a thin silicon dioxide layer is thermally grown, to a thickness between about 20 to 40 Angstroms, on semiconductor substrate 1. A photoresist shape, (not shown in the drawings, and one of the two additional masking steps added to the process to improve logic performance), is used to mask DRAM region 60, from a wet etch procedure used to remove the thin silicon dioxide layer from logic region 50. After removal of the photoresist shape, using plasma oxygen ashing and careful wet cleans, another thermal oxidation procedure is performed, in an oxygen - steam ambient, creating silicon dioxide gate insulator layer 7, in logic region 50, at a thickness between about 40 to 60 Angstroms, while the same thermal oxidation procedure results in a silicon dioxide gate insulator layer 8, comprised partially of the previously used thin silicon oxide layer, with a final thickness now between about 50 to 70 Angstroms. This is schematically shown in FIG. 3.

Figure 4:
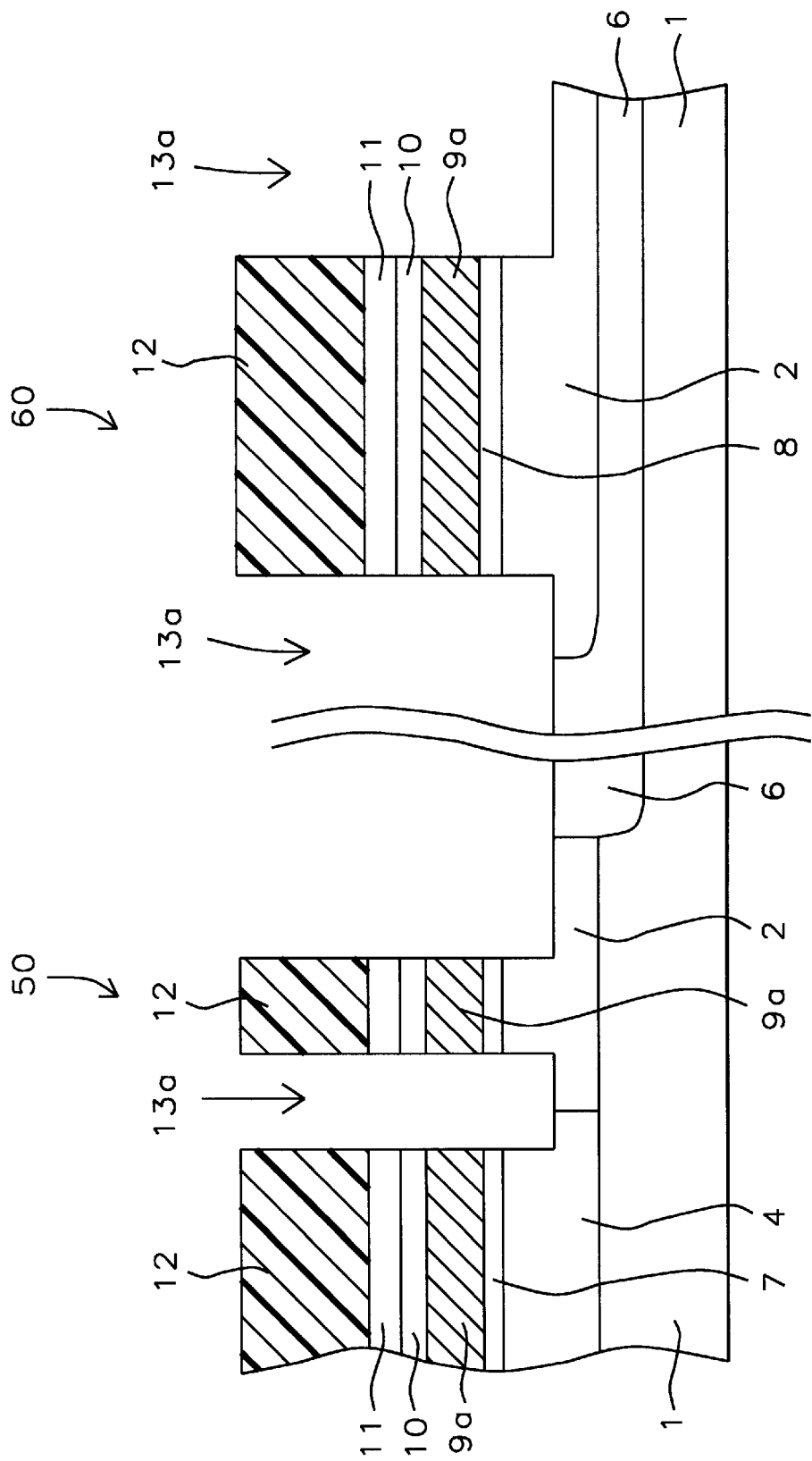
Figure 5:
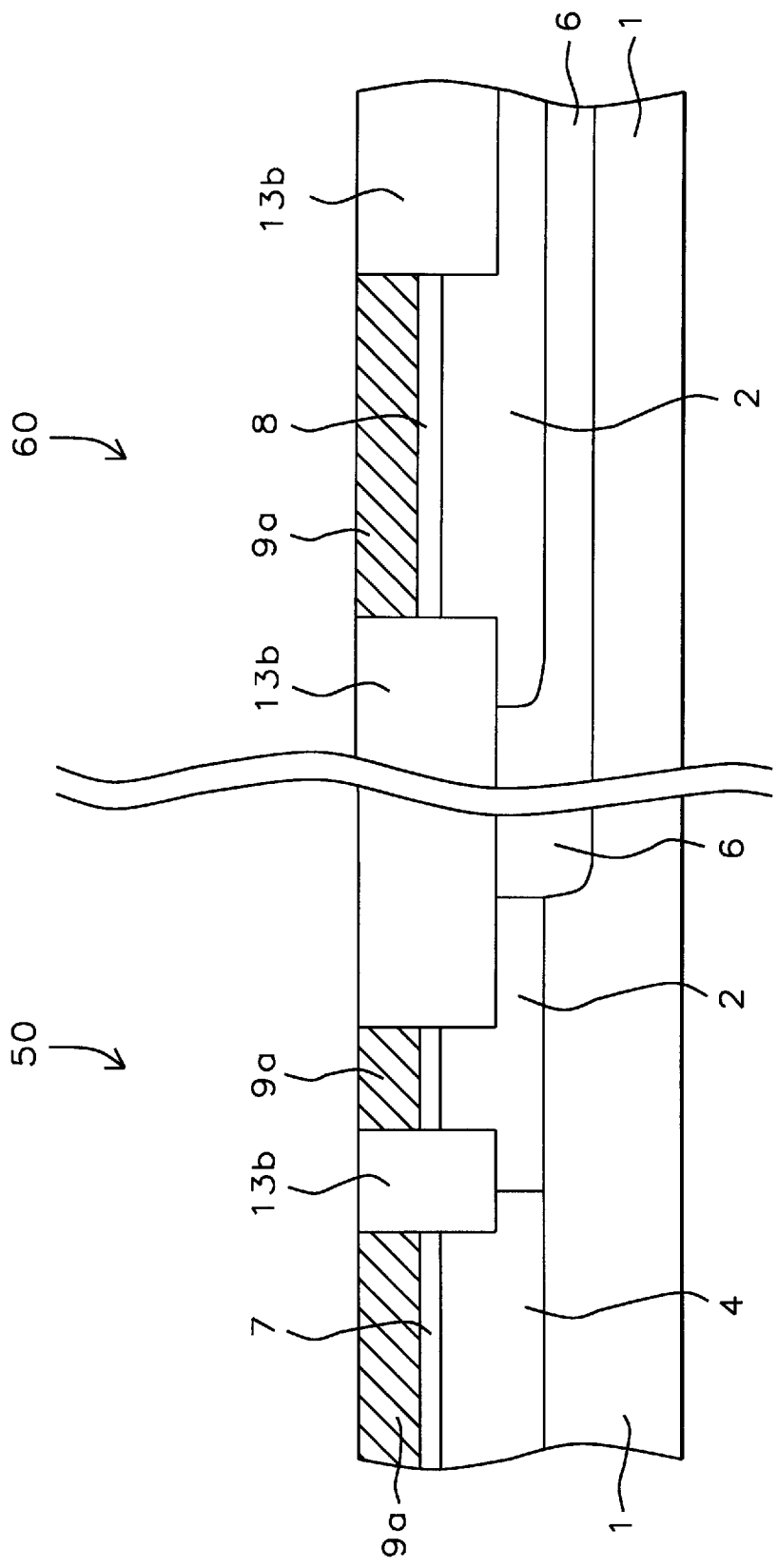

An undoped polysilicon layer 9a, is next deposited using low pressure chemical vapor deposition, (LPCVD), procedures, to a thickness between about 800 to 1200 Angstroms. A silicon oxide layer 10, is then deposited via LPCVD or plasma enhanced chemical vapor deposition, (PECVD), procedures, to a thickness between about 100 to 300 Angstroms, followed by a deposition of a silicon nitride layer 11, deposited using LPCVD or PECVD procedures, to a thickness between about 1200 to 2000 Angstroms. A photoresist shape 12, is used as a mask allowing an anisotropic RIE procedure to create shallow trenches 13a, using CHF$_3$ as an etchant for silicon nitride layer 11, for silicon oxide layer 10, for gate insulator layer 7, and for gate insulator layer 8, while using Cl$_2$ as an etchant for undoped polysilicon layer 9a, and for semiconductor substrate 1. Shallow trenches 13a, schematically shown in FIG. 4, are created to a depth of between about 3000 to 5000 Angstroms, in semiconductor substrate 1. After removal of photoresist shape 12, via plasma oxygen ashing and careful wet cleans, a silicon oxide layer is deposited, via high density plasma chemical vapor deposition, (HDPCVD) procedures, completely filling shallow trenches 13a. A chemical mechanical polishing, (CMP), procedure is used to remove unwanted silicon oxide, from the top surface of silicon nitride layer 11, followed by the removal of silicon nitride layer 11, and silicon oxide layer 10, via a wet etch procedure, using buffered HF for silicon oxide layer 10, and using a hot phosphoric acid for silicon nitride layer 11, resulting in insulator filled, shallow trench isolation, (STI), regions, 13b, schematically shown in FIG. 5.

Figure 6:
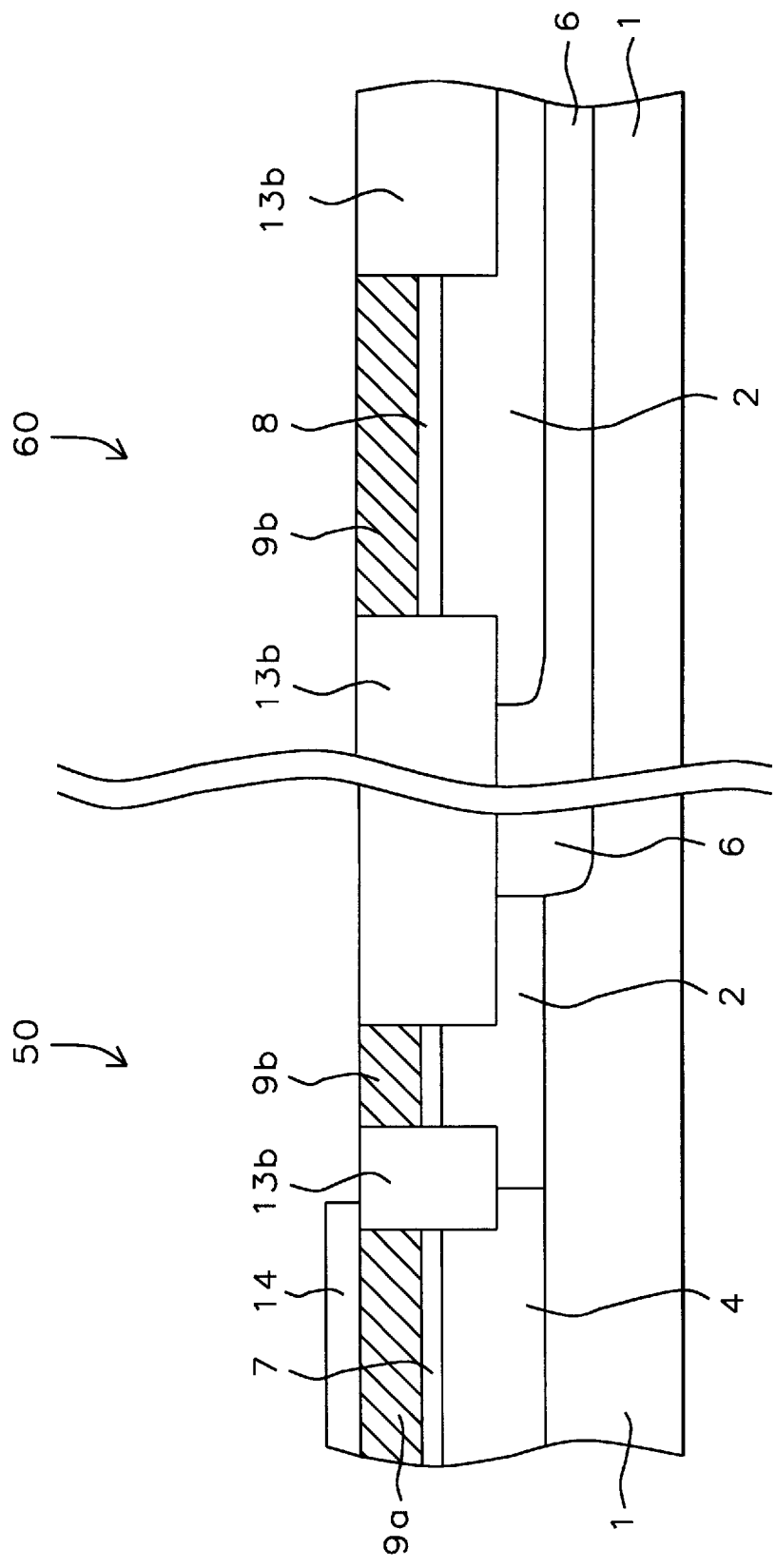
Figure 7:
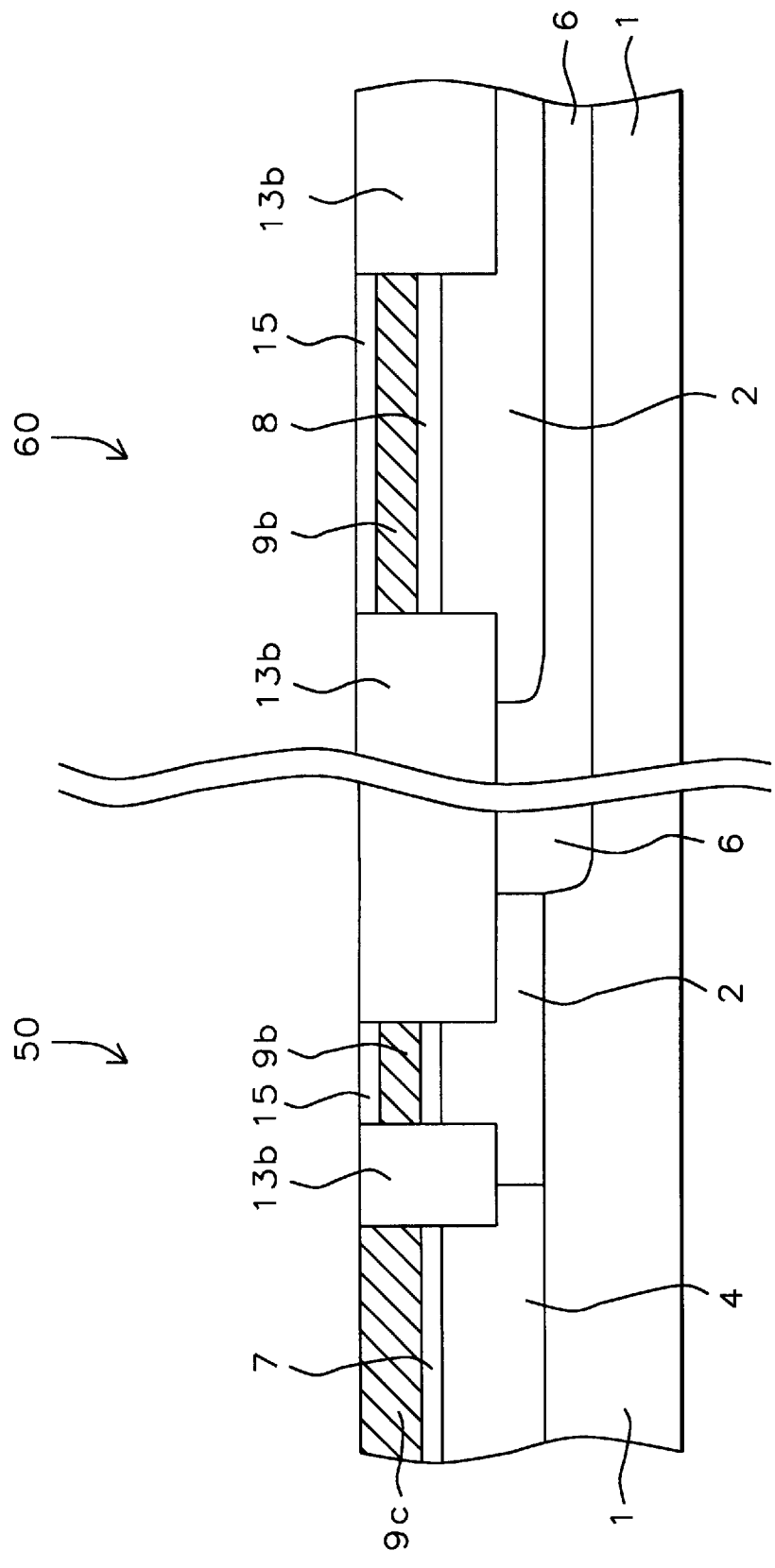

A silicon nitride layer 14, is next deposited using LPCVD or PECVD procedures, to a thickness between about 1000 to 1500 Angstroms. A photoresist shape, (not shown in the drawings, and the second mask added to the process for logic performance improvement), is used as a mask to allow removal of silicon nitride layer 14, in DRAM region 60, and in the area of logic region 50, to be used for N channel CMOS devices. After removal of the masking photoresist shape, via plasma oxygen ashing and careful wet cleans, a POCl$_3$ procedure is used to dope exposed regions of undoped polysilicon layer 9a, and creating N type polysilicon layer 9b, in DRAM region 60, as well as in logic region 50, to be used for N channel CMOS devices. The furnace $POCl_3$ procedure was chosen for polysilicon doping, rather then an ion implantation procedure, which can damage underlying gate insulator layers. The result of this procedure is schematically shown in FIG. 6. A silicon oxide layer 15, is thermally grown, on N type doped, polysilicon layers 9b, to a thickness between about 300 to 600 Angstroms, allowing removal of silicon nitride layer 14, via use of a hot phosphoric acid solution. A blanket, boron ion implantation procedure is used, at an energy between about 0.5 to 1 KeV, and at a dose between about 1E15 to 5E15 atoms/cm$^2$, resulting in exposed, undoped polysilicon layer 9a, in an area of logic region 50, to be used for subsequent P channel CMOS devices, to be converted to P type polysilicon layer 9c, with a surface concentration between about 0.75 to 1.25E21 atoms/cm$^3$. The N type dopant concentration for N type polysilicon layer 9b, is between about 0.75 to 1.25E22, and therefore even if N type polysilicon layer 9b, was subjected to the boron ion implantation procedure, the level of P type compensation still would not be enough to convert N type polysilicon layer 9b. This is schematically shown in FIG. 7.

Figure 8:
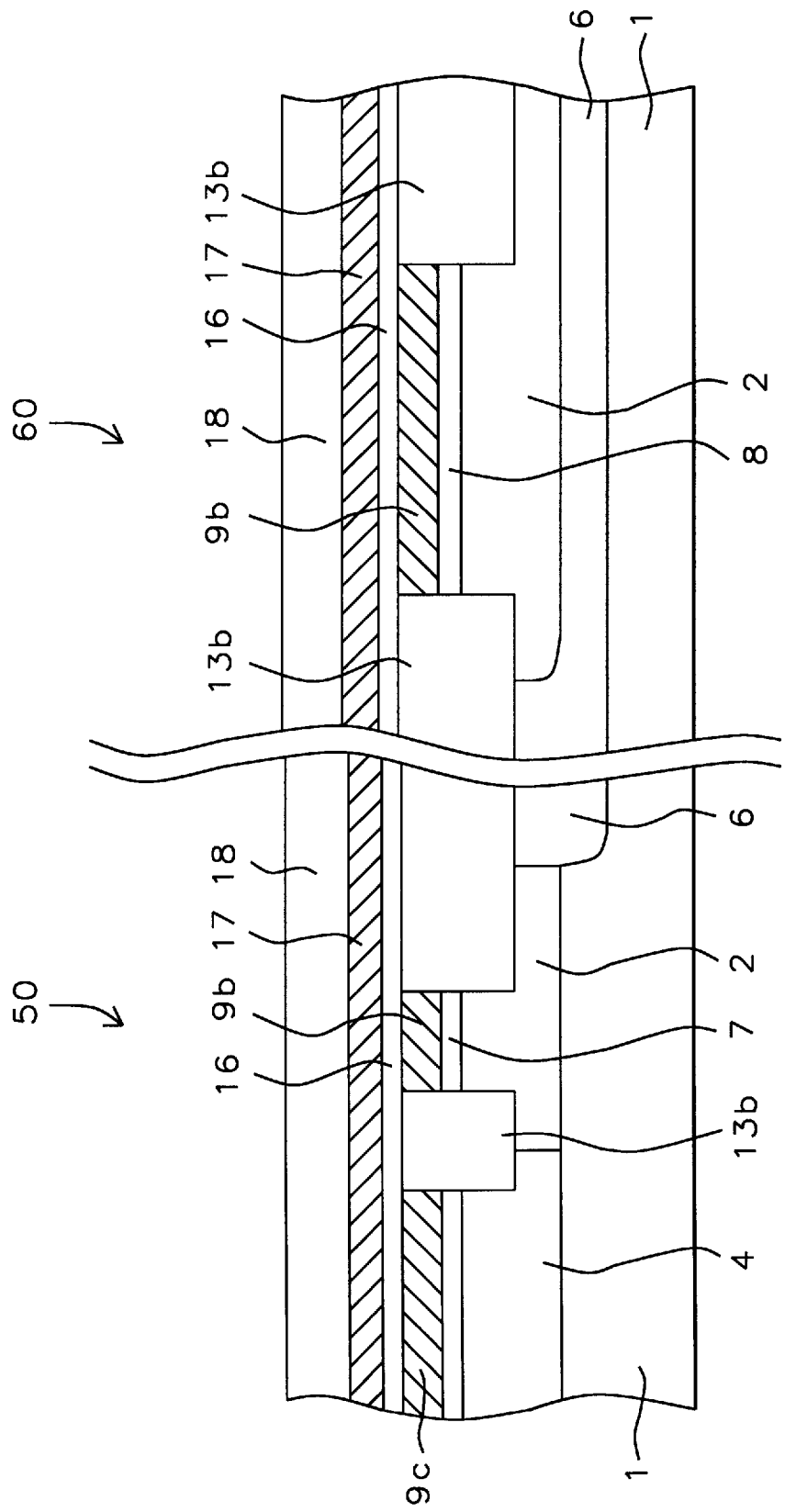
Figure 9:
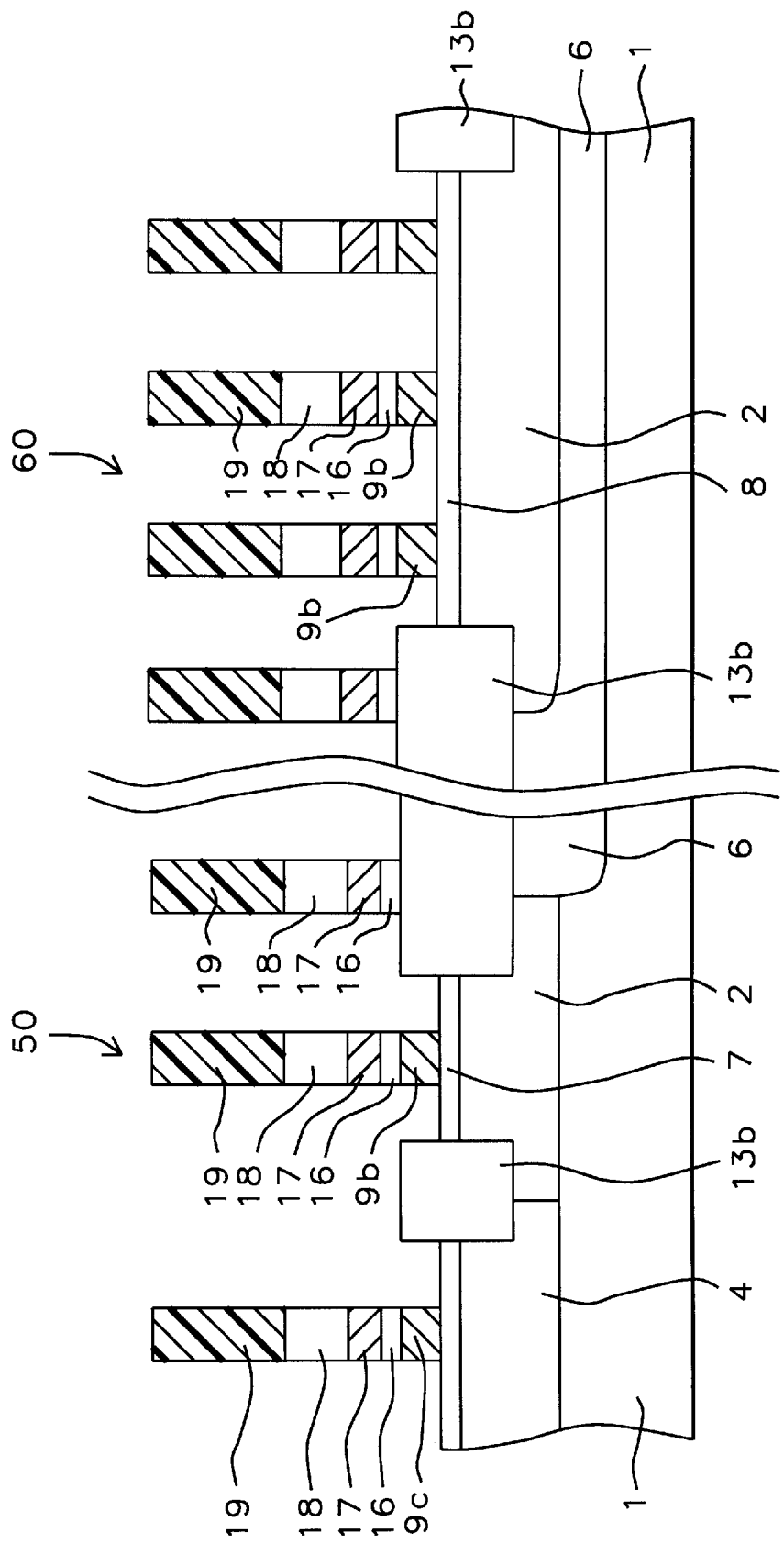

After removal of silicon oxide layer 15, via a wet etch procedure, a titanium nitride layer 16, is deposited using R.F. sputtering procedures, to a thickness between about 80 to 120 Angstroms, followed by the deposition of a titanium disilicide layer 17, deposited using R.F. sputtering procedures to a thickness between about 750 to 1250 Angstroms, and finally a silicon nitride layer 18, is deposited using PECVD or LPCVD procedures, to a thickness between about 1500 to 2500 Angstroms. The result of these depositions is schematically shown in FIG. 8. Photoresist shapes 19, are next employed as a mask, allowing polycide gate structures to be formed. Polycide, (titanium disilicide on polysilicon), structures, capped with silicon nitride, are formed via anisotropic RIE procedures, using $CHF_3$ as an etchant for silicon nitride layer 18, and using $Cl_2$ as an etchant for titanium disilicide layer 17, for titanium nitride layer 16, and for the polysilicon layers. Polycide structures in DRAM region 60, and in the area of the logic region 50, used for N channel CMOS devices, are comprised with N type polysilicon layer 9b, while the polycide structure, in the area of the logic region 50, used for P channel CMOS devices, is comprised with P type polysilicon layer 9c. This is schematically shown in FIG. 9.

Figure 10:
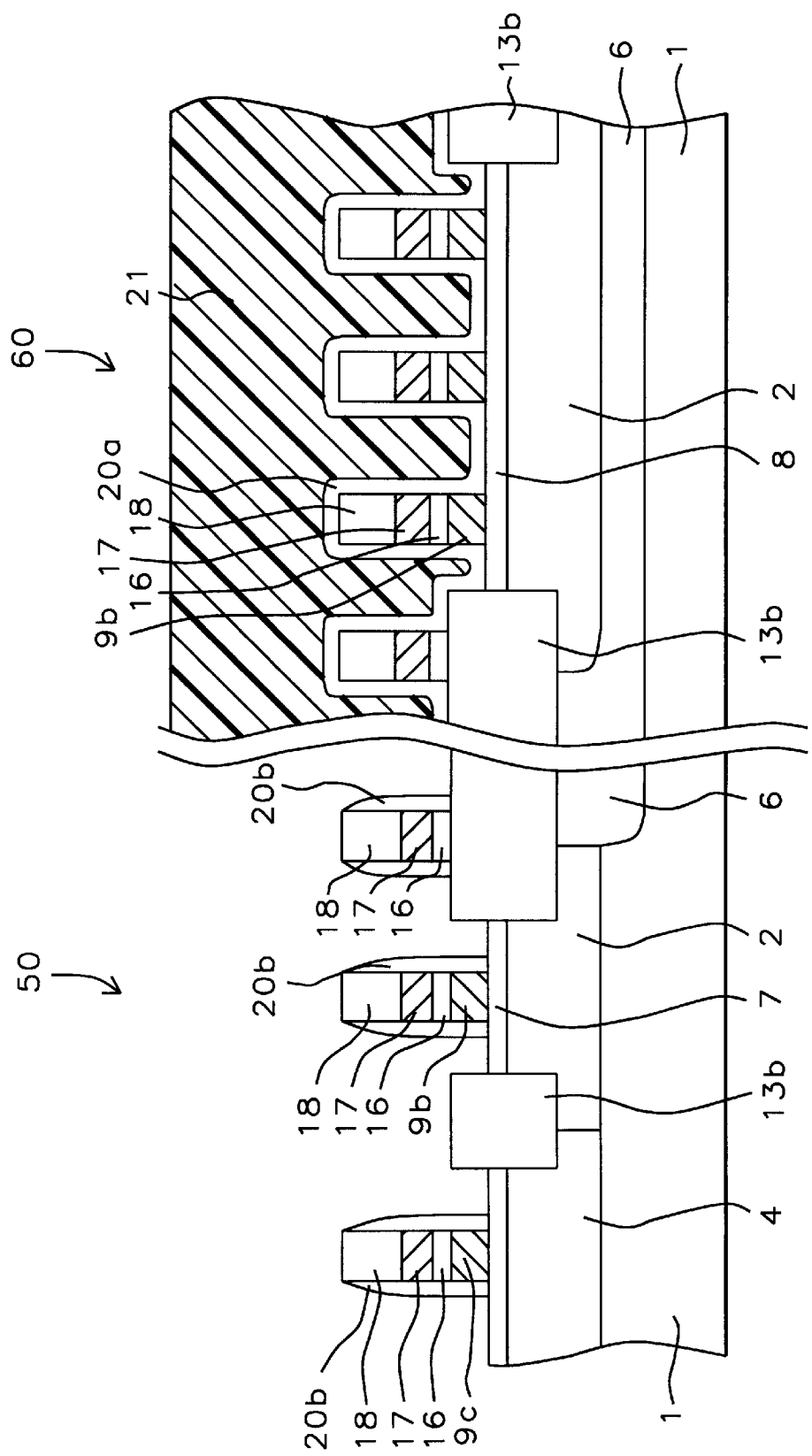

After removal of photoresist shapes 19, via plasma oxygen ashing and careful wet cleans, a composite layer of underlying silicon oxide, and overlying silicon nitride, are deposited using PECVD or LPCVD procedures. The thin silicon oxide layer, about 100 Angstroms in thickness, is not shown in the drawings, and is used to separate silicon nitride layer 20a, from direct contact with silicon or polysilicon regions. Silicon nitride layer 20a, shown schematically in FIG. 10, in DRAM region 60, is deposited to a thickness between about 600 to 1000 Angstroms. A photoresist shape 21, is used as a mask to protect silicon nitride layer 20a, from an anisotropic RIE procedure, performed in logic region 50, via use of $CHF_3$ as an etchant, creating silicon nitride spacers 20b, on the sides of the polycide structures, in logic region 50. The spacers are actually composite spacers of silicon nitride on silicon oxide, however to avoid complexity it will be identified as silicon nitride spacers 20b. This is shown schematically in FIG. 10.

Figure 11:
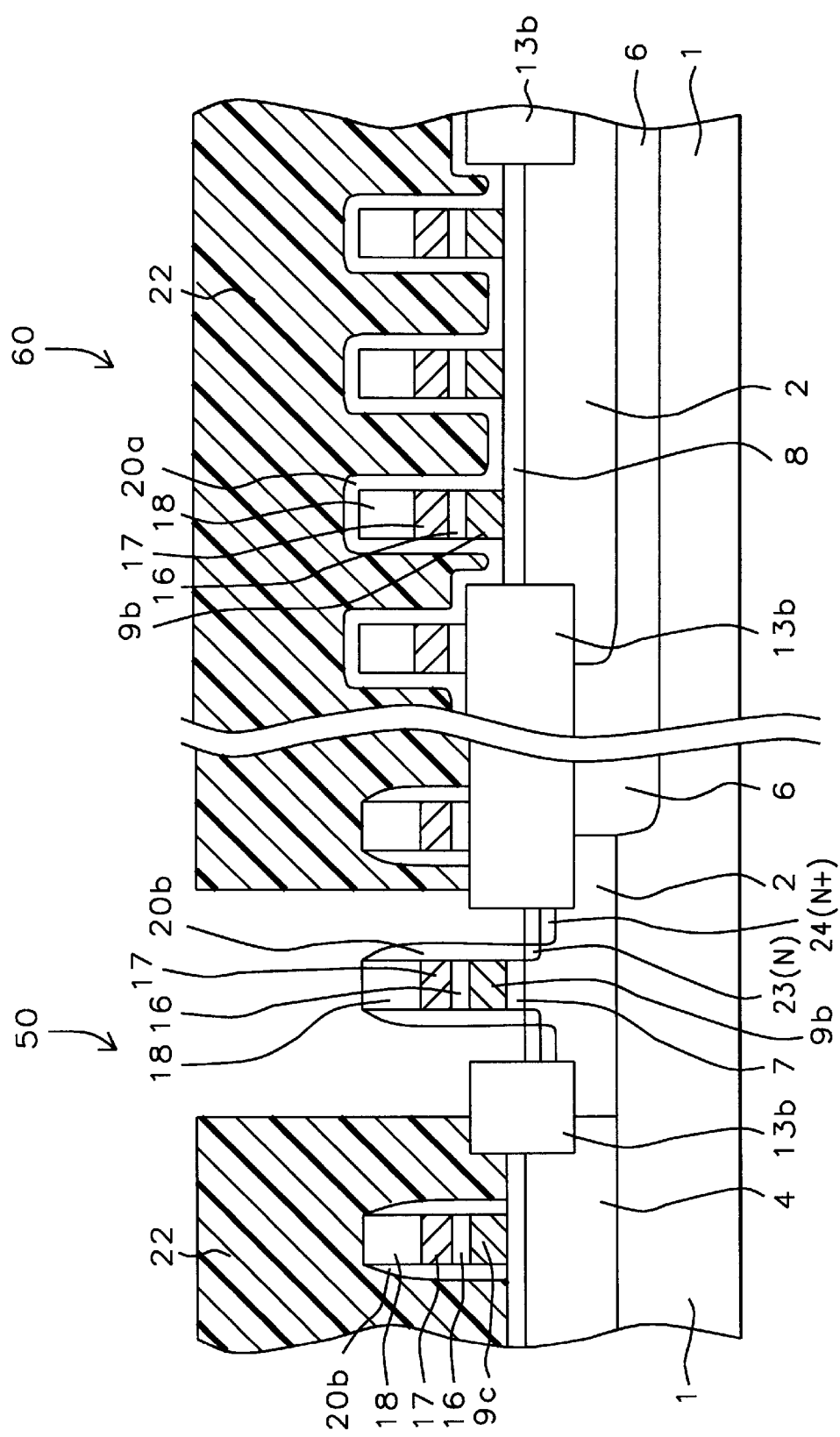

After removal of photoresist shape 21, via plasma oxygen ashing and careful wet cleans, photoresist shape 22, is created, and used as a block out mask, allowing lightly doped, and heavily doped, source and drain regions to be established in logic region 50, in an area used for the N channel CMOS devices. First an N type, lightly doped source and drain region 23, is created via ion implantation of arsenic or phosphorous ions, at an energy between about 30 to 50 KeV, and at a dose between about 1E13 to 3E13 atoms/cm$^2$. This implantation procedure is performed using a tilt angle between about 30° to 40°, to allow placement of the implanted N type species, under silicon nitride spacers 20b. An N type, heavily doped source and drain region 24, is than formed by ion implantation of arsenic or phosphorous, at an energy between about 30 to 50 KeV, at a dose between about 1E15 to 5E15 atoms/cm$^3$, and using a angle between about 0 to 7°. Regions of exposed silicon dioxide gate insulator layer 7, not covered by the polycide gate structure, is removed using a wet etch procedure. The result of these procedures is schematically illustrated in FIG. 11.

Figure 12:
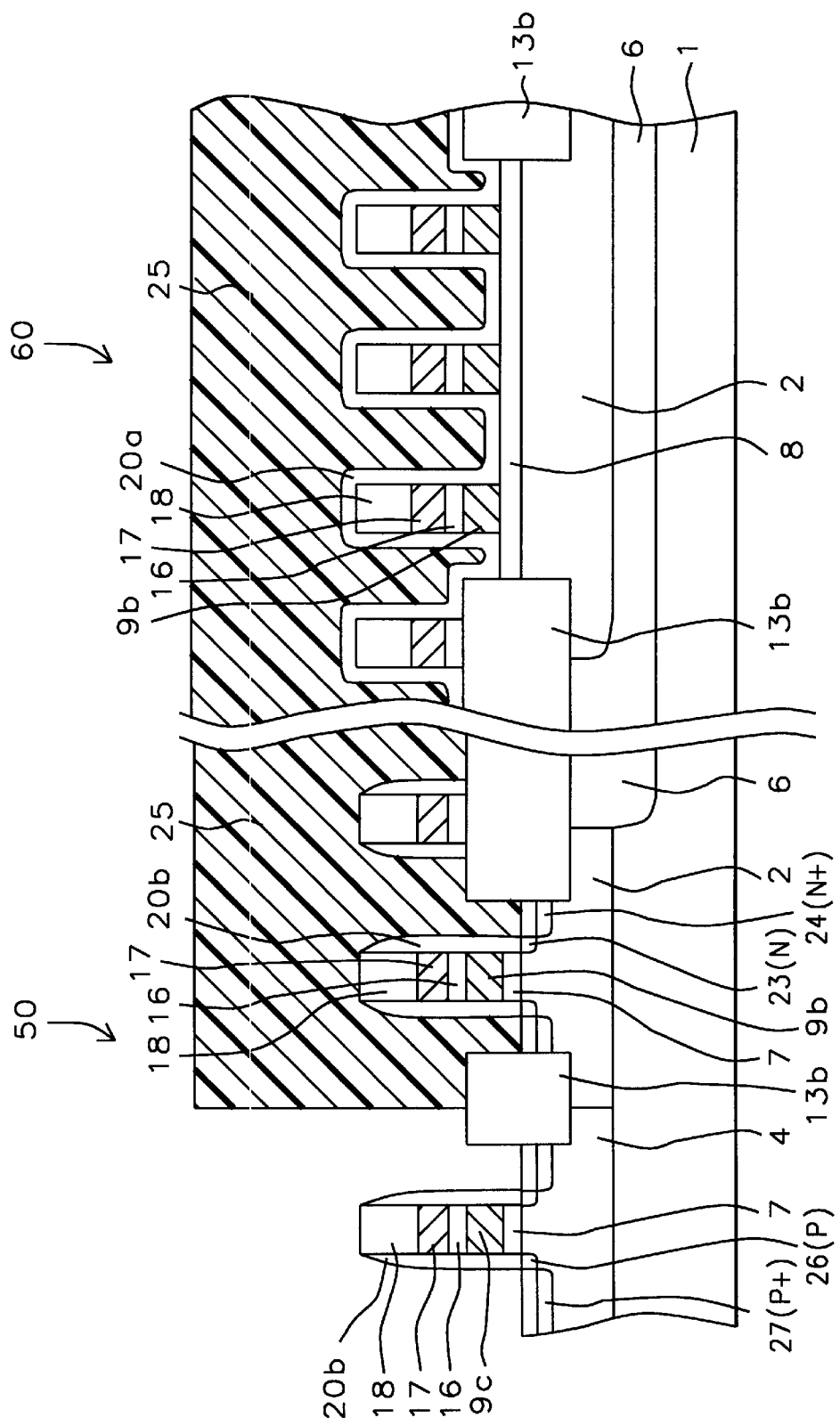

A similar process sequence is next employed to create both lightly doped, and heavily doped, P type source and drain regions, in logic region 50, in an area used for P channel CMOS devices. After removal of photoresist shape 22, via plasma oxygen ashing and careful wet cleans, photoresist shape 25, is formed, and used as a block out mask, allowing ion implantation only to be performed in regions where P channel CMOS devices are to be created. First a P type, lightly doped source and drain region 26, is formed via ion implantation of boron, at an energy between about 0.5 to 1.0 KeV, at a dose between about 1E13 to 3E13 atoms/cm$^2$, and at an implant angle between about 30° to 45°, allowing the P type, lightly doped source and drain region 26, to be located in semiconductor substrate 1, below silicon nitride spacers 20b. Next a P type, heavily doped source and drain region 27, is formed via ion implantation of boron, at an energy between about 0.5 to 1.0 KeV, at a dose between about 1E15 to 5E15 atoms/cm$^2$, at an implant angle between about 0° to 7°. Regions of exposed silicon oxide gate insulator layer 7, not covered by the polycide gate structure, is removed using a wet etch procedure. The result of these process steps is schematically shown in FIG. 12.

Figure 13:
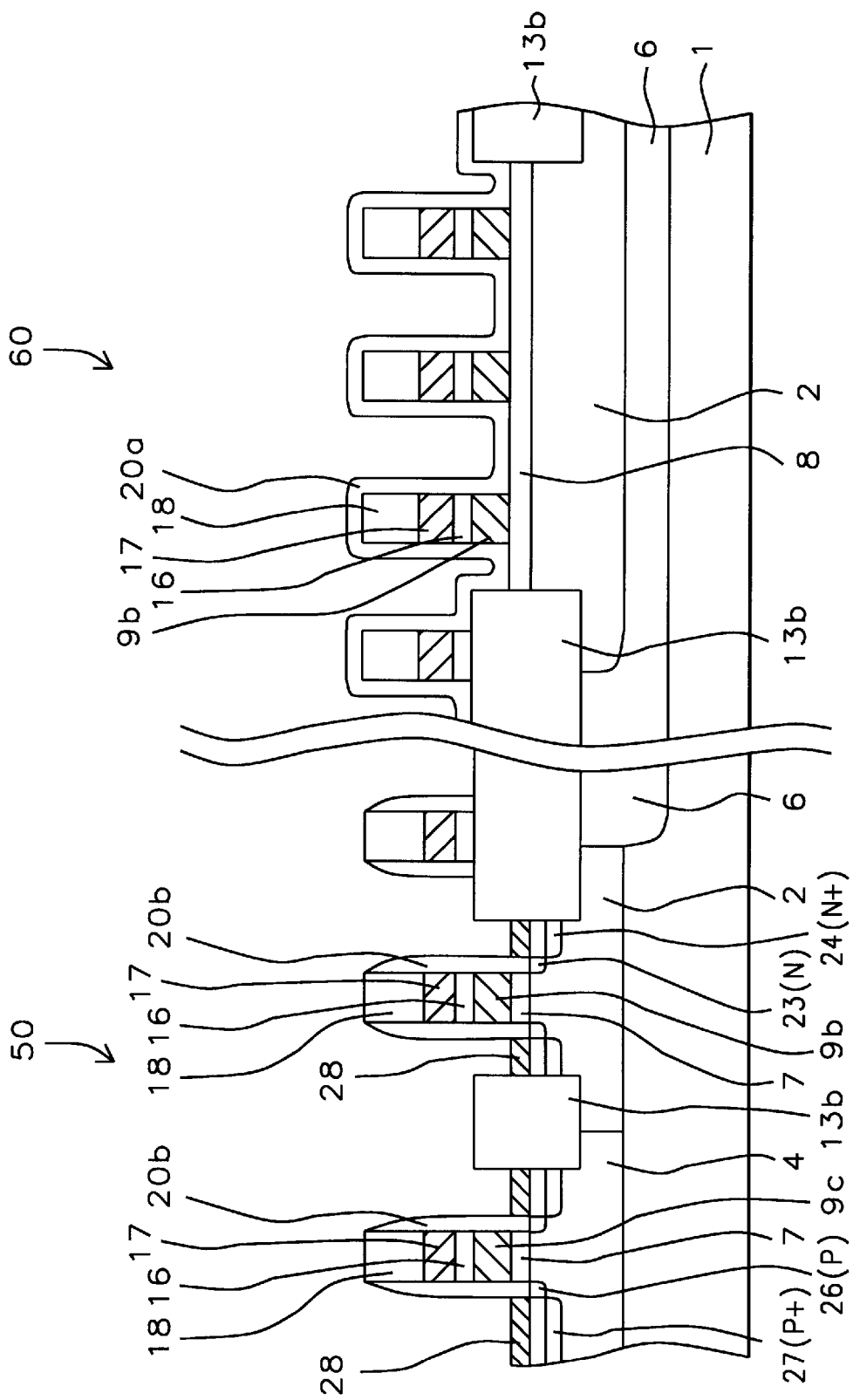

After removal of photoresist shape 25, using plasma oxygen ashing and careful wet cleans, titanium disilicide layer 28, is formed on source and drain regions, exposed in logic region 50. First a titanium layer is deposited, using an R.F. sputtering procedure, to a thickness between about 300 to 600 Angstroms. A rapid thermal anneal, (RTA), procedure, is next employed, at a temperature between about 600° to 700° C., for a time between about 60 to 90 sec, in an $N_2$ ambient, to convert titanium to titanium silicide layer 28, in regions in which titanium interfaced silicon, or exposed P type, and N type, source and drain regions. In regions in which titanium interfaced silicon nitride spacers 20b, silicon nitride layer 20a, or silicon oxide filled shallow trench 13b, titanium remains unreacted, and is selectively removed using a 5:1:1 solution of $H_2O$—$NH_4OH$—$H_2O_2$. This is shown schematically in FIG. 13. This procedure, creating titanium silicide only in source and drain regions, while using previously deposited titanium disilicide layer 17, for the polycide gate structure, avoids a possible bridging mechanism that can occur when the metal silicide is formed for both the gate and the source and drain regions, during the same procedure.

Figure 14:
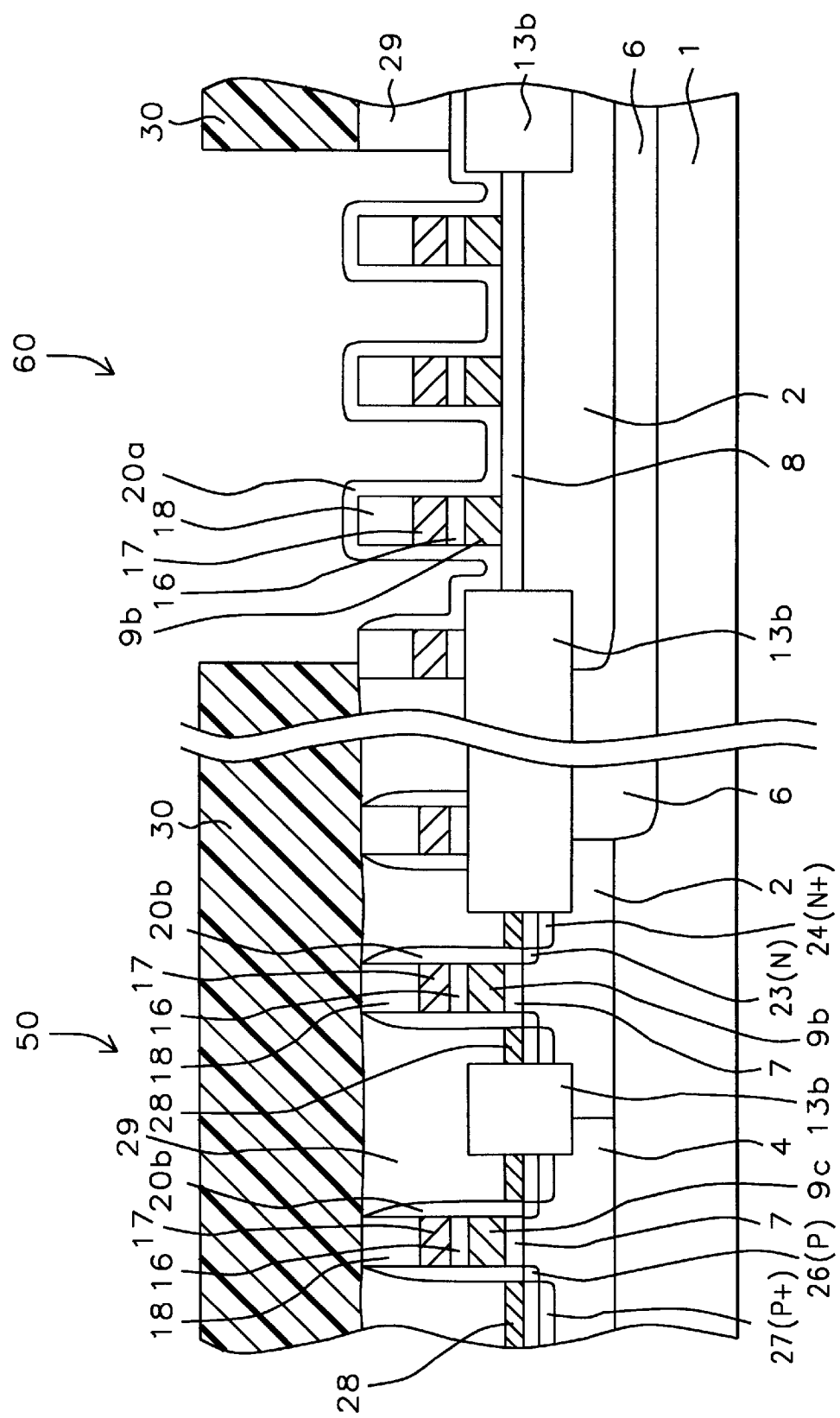
Figure 15:
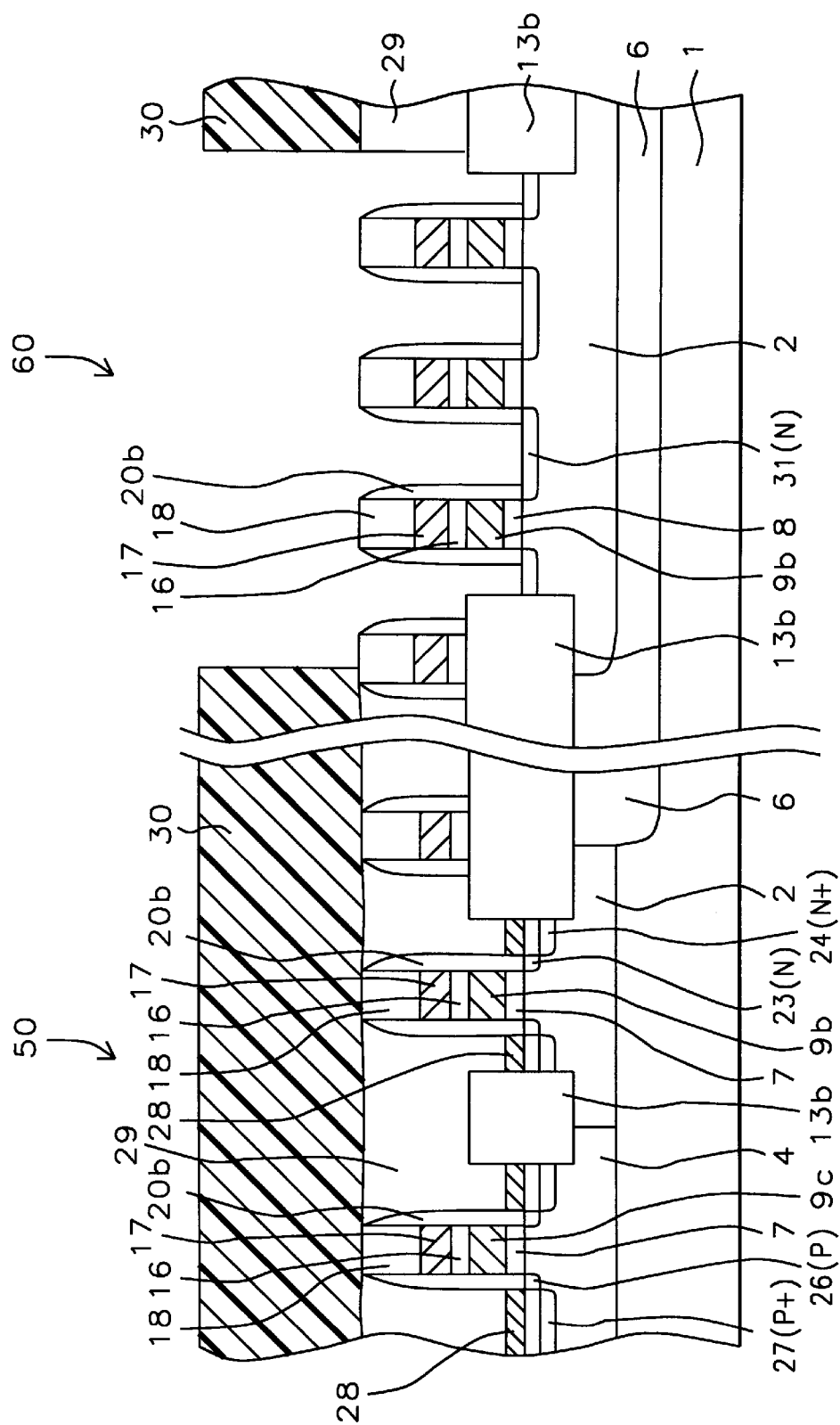

FIG. 14, schematically shows the formation of silicon oxide layer 29, in spaces between polycide gate structures, in logic region 50. First silicon oxide layer 29, is deposited using PECVD or LPCVD procedures, to a thickness between about 5000 to 8000 Angstroms. A CMP procedure is used to planarize silicon oxide layer 29, creating a smooth top surface topography. Photoresist shape 30, is next used as a block out mask, allowing silicon oxide layer 29, to be selectively removed from DRAM region 60, via use of a RIE procedure, using $C_2H_8$—$CF_4$—$O_2$ as an etchant, stopping on underlying silicon nitride layer 20a. This is schematically shown in FIG. 14. With photoresist shape 30, still in place, silicon nitride spacers 20b, are formed on the sides of polycide gate structures, in DRAM region 60, via an anisotropic RIE procedure, applied to silicon nitride layer 20a, using $CHF_3$ as an etchant. Next N type, lightly doped source and drain regions 31, are formed via ion implantation of arsenic or phosphorous, at an energy between about 20 to 40 KeV, at a dose between about 4E12 to 8E12 atoms/cm, and at an implant angle between about 30° to 45°, allowing N type, lightly doped source and drain regions 31, to be formed in semiconductor substrate 1, under silicon nitride spacers 20b. This is schematically shown in FIG. 15.

Figure 16:
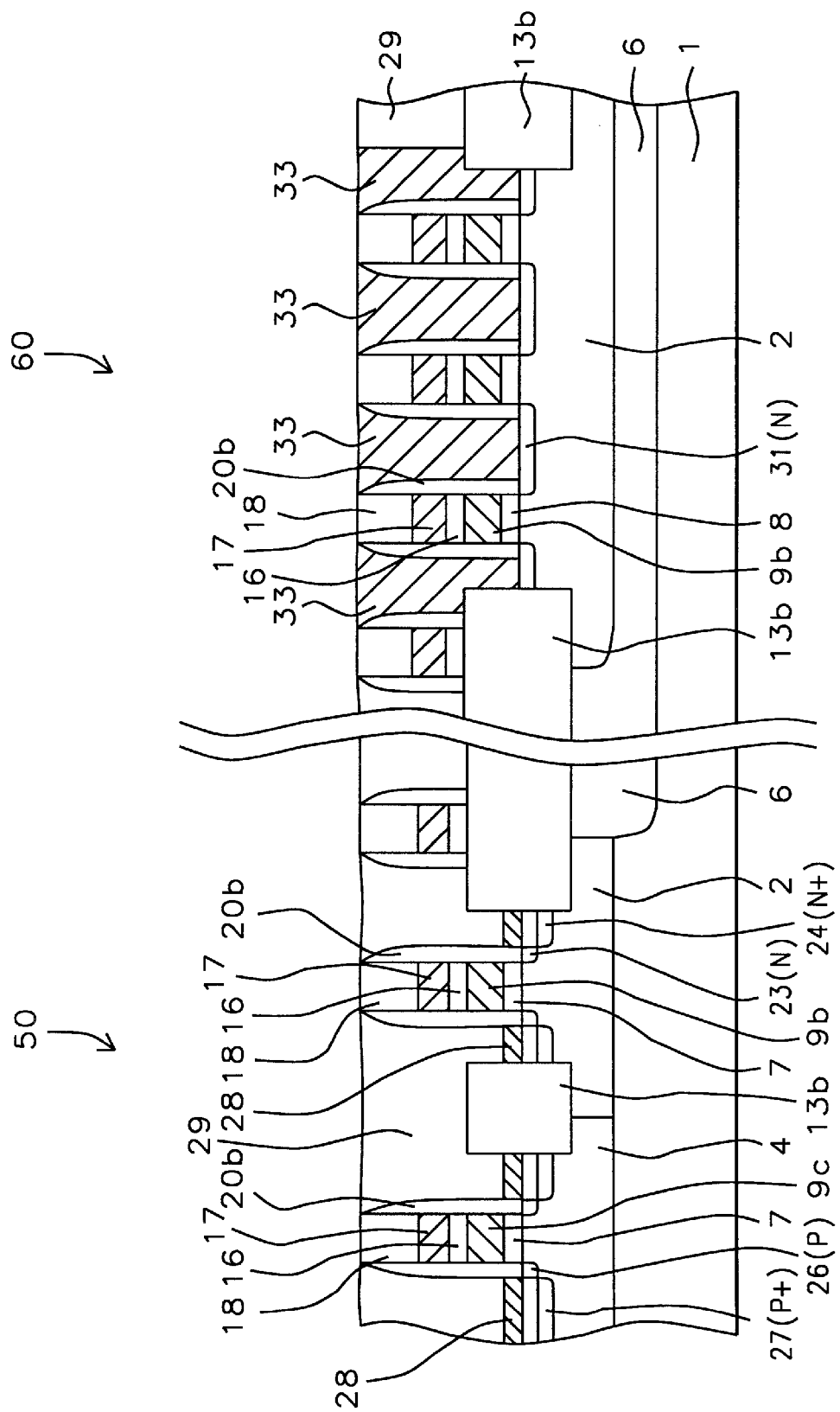

After removal of photoresist shape 30, again using plasma oxygen ashing and careful wet cleans, a polysilicon layer is deposited, using LPCVD procedures, to a thickness between about 4000 to 8000 Angstroms. The polysilicon layer can be in situ doped N type, during deposition, or the polysilicon layer can be deposited intrinsically and then doped via N type, ion implantation procedures. A CMP procedure is next used to completely remove unwanted regions of the polysilicon layer from logic region 50, while also removing unwanted polysilicon from the top surface of silicon oxide layer 29, and silicon nitride layer 18, in DRAM region 60, resulting in polysilicon plugs 33, located between polycide gate structures, in DRAM region 60, overlying and contacting N type contact regions 31. This is schematically displayed in FIG. 16.

Figure 17:
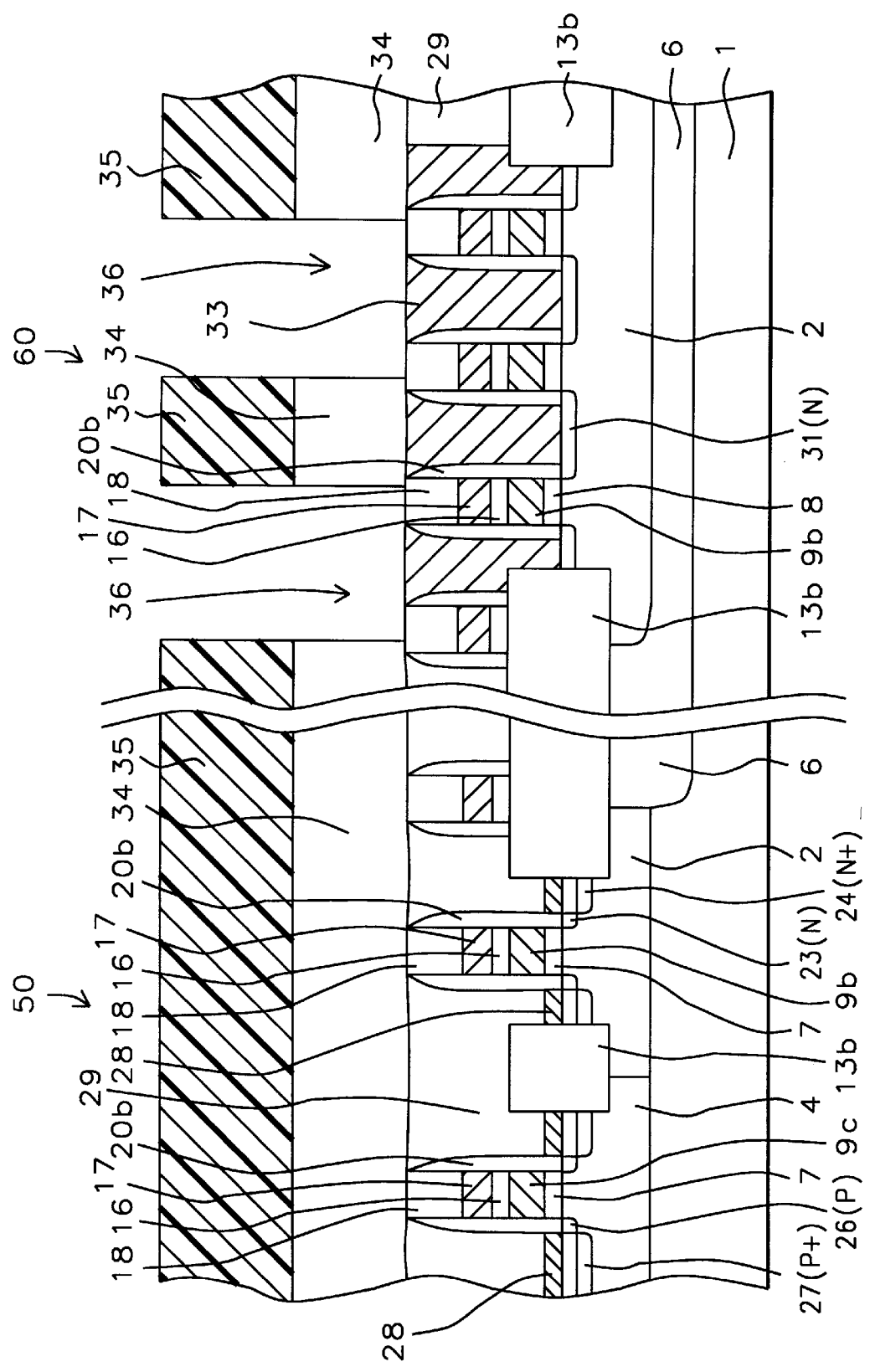
Figure 18:
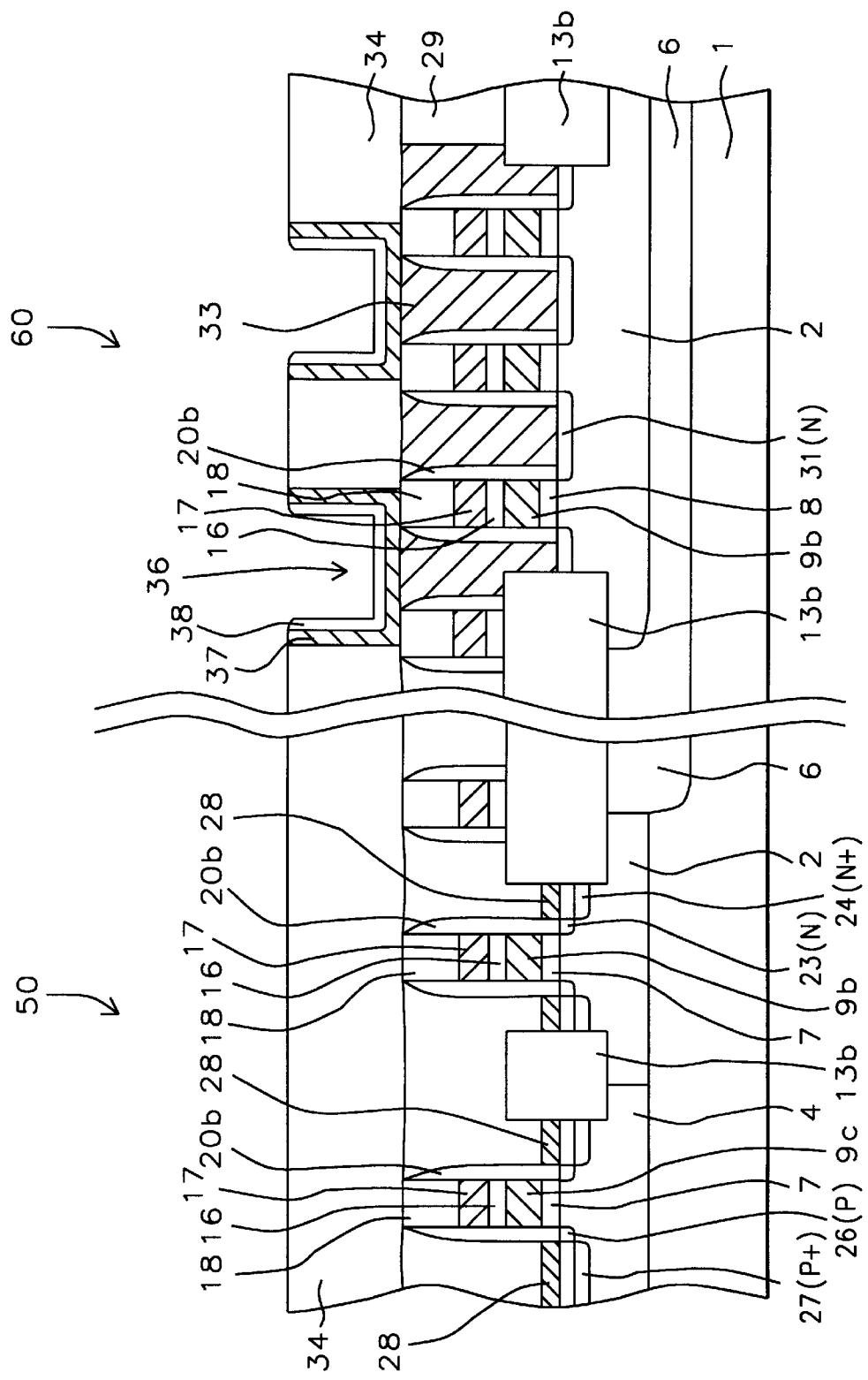

A thick silicon oxide layer 34, is deposited using LPCVD or PECVD procedures, to a thickness between about 5000 to 10000 Angstroms. Photoresist shape 35, is used to allow storage node openings 36, to be formed in thick silicon oxide layer 34, via a selective, anisotropic RIE procedure using $C_2F$, —$CF_4$—$O_2$, as an etchant. The selectivity of the etchant does not allow polysilicon plugs 33, or silicon nitride layer 18, exposed at RIE endpoint, to be etched. The thickness of silicon oxide layer 34, will influence the height, and therefore the capacitance, of a subsequently formed capacitor structure, to be located in storage node openings 36. This is schematically shown in FIG. 17. After removal of photoresist shape 35, via plasma oxygen ashing and careful wet cleans a thin, N+ polysilicon layer 37, is deposited via LPCVD procedures, to a thickness between about 500 to 700 Angstroms. A titanium nitride, or tungsten nitride layer, can be used to replace polysilicon layer 37, if desired. However since polysilicon layer 37, will be used for the storage node of a capacitor structure, another option is the use a hemispherical grained, (HSG), polysilicon layer, to increase surface area of the storage node structure. Next the capacitor dielectric layer 38, is created. Capacitor dielectric layer 38, can be an Oxynitride—Nitride —Oxide, (ONO), layer, or any insulator with a high dielectric constant. If ONO is the choice it can be created by first thermally growing a silicon oxide layer, at a thickness between about 10 to 20 Angstroms, on the surface of polysilicon layer 37, followed by the deposition of a silicon nitride layer, using LPCVD or PECVD procedures, at a thickness between about 50 to 80 Angstroms. An oxidation procedure, in an oxygen -stream ambient, at a temperature between about 750° to 900° C., converts the surface of the silicon nitride layer to a oxynitride. The resulting ONO layer 38, has a equivalent silicon oxide thickness between about 25 to 55 Angstroms. Another option for the capacitor dielectric layer 38, is a $Ta_2O_5$ layer, a barium strontium titanate, (BST), layer, or a lead zirconium titanate, (PZT), layer, at an equivalent silicon oxide thickness between about 25 to 55 Angstroms. A CMP procedure is next performed, resulting in polysilicon, storage node layer 37, and capacitor dielectric layer 38, residing only in storage node openings 36. This is shown schematically in FIG. 18.

Figure 19:
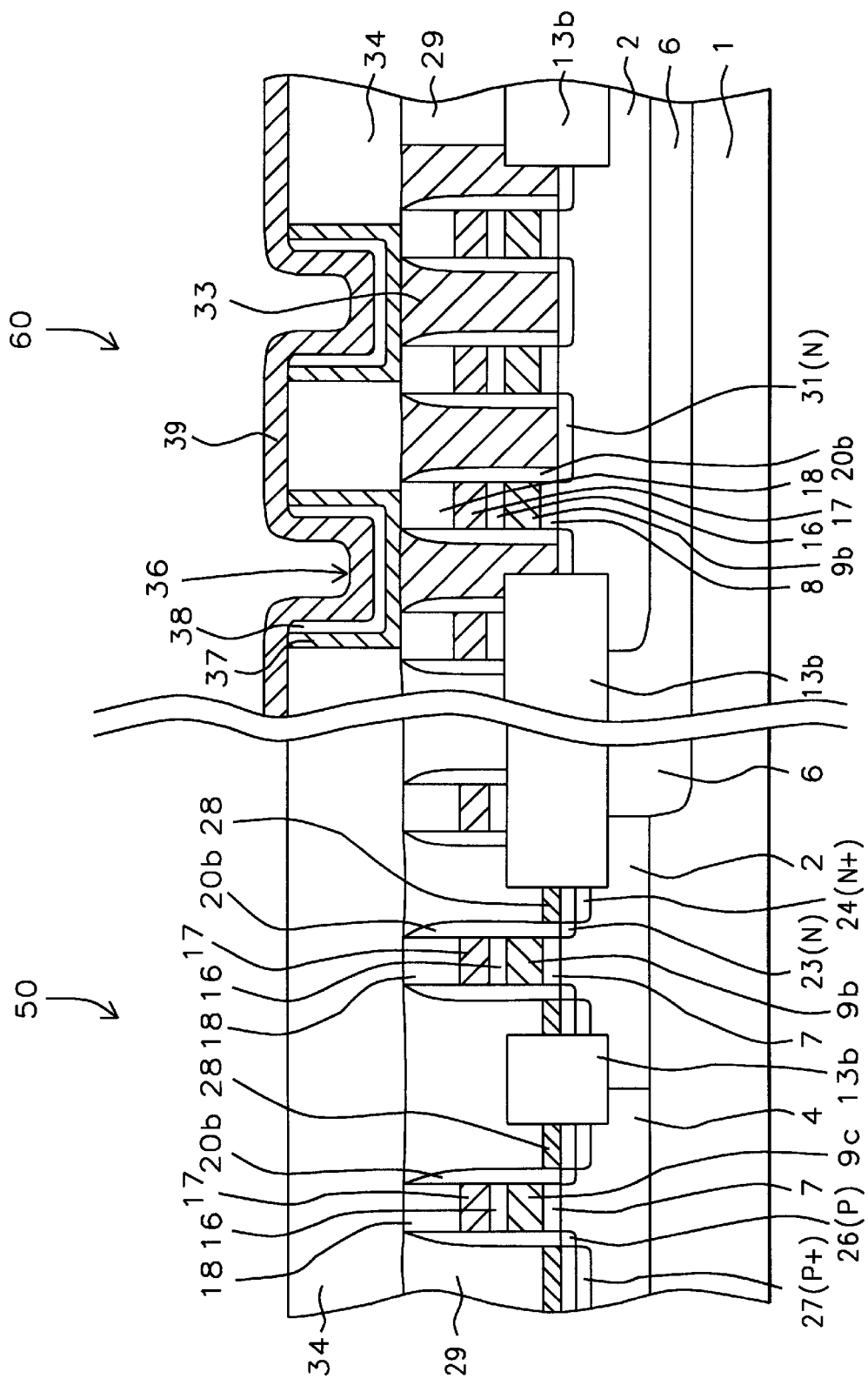

A polysilicon layer 39, is next deposited using LPCVD procedures, to a thickness between about 500 to 1000 Angstroms. Polysilicon layer 39, is either doped during an in situ doping procedure, by the addition of arsine or phosphine to a silane ambient, or polysilicon layer 39, can be deposited intrinsically and doped via ion implantation of either arsenic or phosphorous. A titanium nitride or a tungsten nitride layer, can be used in place of polysilicon layer 39, if desired. A photoresist shape, not shown in the drawings, is used as a mask to allow anisotropic RIE patterning of polysilicon layer 39, using $Cl_2$ as an etchant, to occur, resulting in the creation of the polysilicon capacitor top plate, shown schematically in FIG. 19. Removal of photoresist is again accomplished using plasma oxygen ashing and careful wet cleans.

Figure 20:
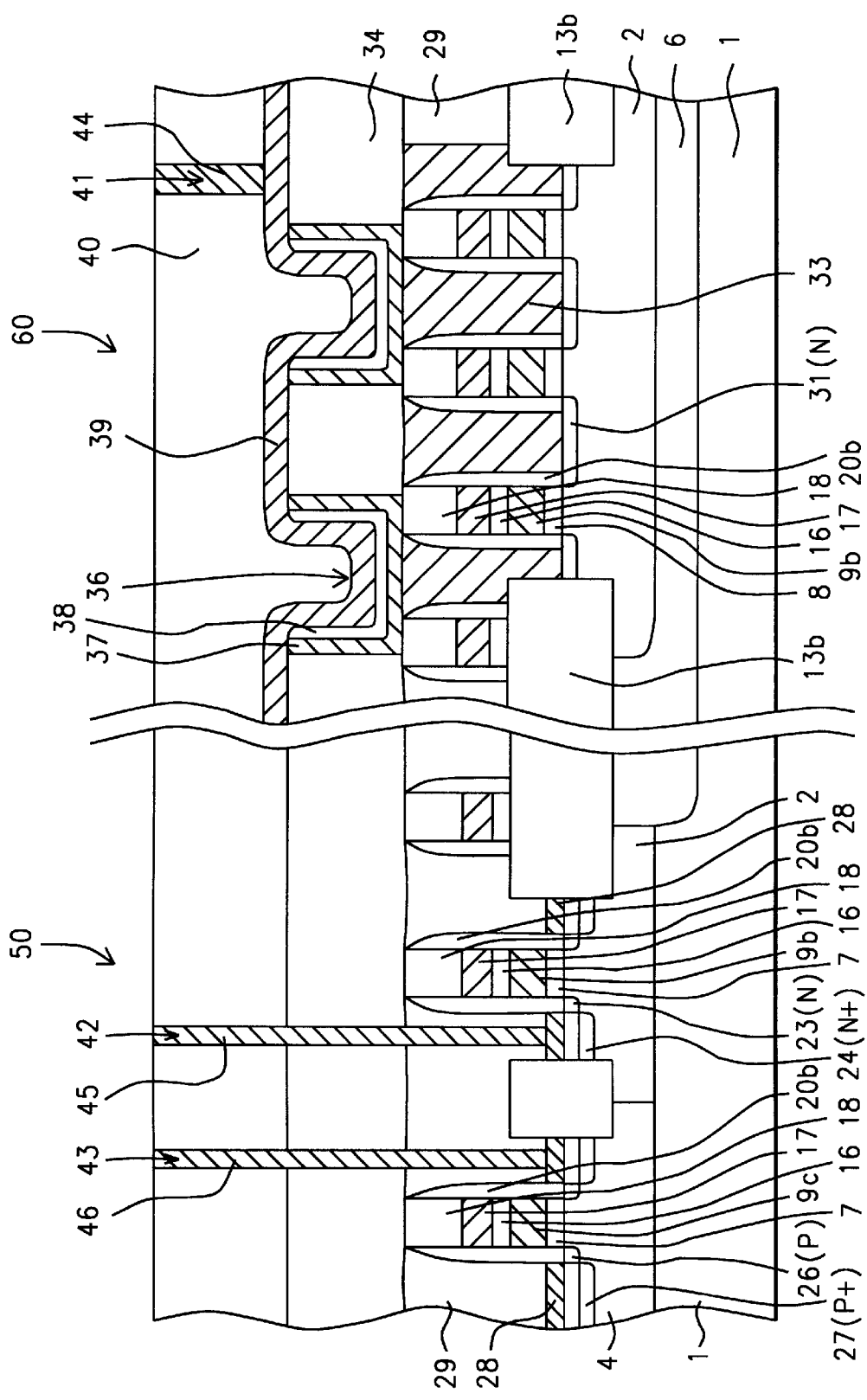

FIG. 20, schematically describes the completion of the high performance logic region 50, and the DRAM region 60, in terms of forming metal contacts and interconnects to active regions. First a silicon oxide layer 40, is deposited, using PECVD or LPCVD procedures, to a thickness between about 5000 to 7000 Angstroms. A photoresist shape, (not shown in the drawings), is used as a mask to allow an anisotropic RIE procedure, using $CHF_3$ as an etchant, to form contact hole 41, exposing the capacitor structure in DRAM region 60, and to form via and contact holes 42 and 43, exposing source and drain regions in logic region 50. Another opening, used for bit line contact, in DRAM region 60, is not shown in the drawings. After removal of the photoresist shape, using plasma oxygen ashing and careful wet cleans, contact and via holes are filled with a metallization comprising a thin, underlying layer of titanium, a thin layer of titanium nitride, and a layer of either tungsten or aluminum—copper. A CMP procedure, or an anisotropic RIE procedure, using $Cl_2$ as an etchant, is used to create metal contacts 44, 45, and 46. This is schematically shown in FIG. 20.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating memory devices, and logic devices, on the same semiconductor chip, using an integrated fabrication process, comprising the steps of:

providing an area of said semiconductor substrate, to be used for said logic devices;

providing another area of said semiconductor substrate, to be used for said memory devices;

forming a P well region in said semiconductor substrate, in a first region of said logic area, to be used with N channel, logic devices;

forming an N well region in said semiconductor substrate, in a second region of said logic area, to be used with P channel logic devices;

forming a P well region in said semiconductor substrate, in said memory area, to be used with N channel memory devices;

forming a first gate insulator layer, on said semiconductor substrate, in said logic area;

forming a second gate insulator layer, on said semiconductor substrate, in said memory area;

forming insulator filled, shallow trenches, to isolate said P well region, in said logic area, from N well region, in said logic area, and to isolate said logic area from said memory area;

forming a polycide gate structure, with an overlying, capping, silicon nitride layer, on said first gate insulator layer, in said second region of said logic area, with said polycide gate structure comprised of metal silicide—titanium nitride—P type polysilicon;

forming a polycide gate structure, with an overlying, capping, silicon nitride layer, on said first gate insulator layer, in said first region of said logic area, with said polycide gate structure comprised of metal silicide—titanium nitride—N type polysilicon;

forming polycide gate structures, with an overlying, capping, silicon nitride layer, on said second gate insulator layer, in said memory area, with said polycide gate structures comprised of metal silicide—titanium nitride—N type polysilicon;

forming silicon nitride spacers on the sides of said polycide gate structure, in said first region of said logic area, and on the sides of said polycide gate structure, in said second region of said logic area;

forming an N type, a lightly doped source and drain region, and N type, heavily doped source and drain region, in said semiconductor substrate, in said first region of said logic area, in an area of said semiconductor substrate not covered by said polycide gate structure;

forming a P type, lightly doped source and drain region, and a P type, heavily doped source and drain region, in said semiconductor substrate, in said second region of said logic area, in an area of said semiconductor substrate, not covered by said polycide gate structure;

forming a metal silicide layer on said P type, heavily doped source and drain region, and on said N type, heavily doped source and drain region, for said logic devices;

forming insulator plugs, between said polycide gate structures, in said logic area;

forming silicon nitride spacers on the sides of said polycide gate structures, in said memory area;

forming N type, lightly doped source and drain regions, in said semiconductor substrate, in said memory area, in an area of said semiconductor substrate, not covered by said polycide gate structures;

forming polysilicon plugs, between said polycide gate structures in said memory area, with said polysilicon plugs overlying, and contacting, said lightly doped source and drain regions;

depositing an insulator layer;

forming a storage node opening, in said insulator layer, exposing top surface of said polysilicon plugs, in said memory area;

forming a capacitor structure, in said storage node opening, overlying, and contacting, said polysilicon plugs; and forming a metal contact structure to said capacitor structure, in said memory area, to said N type, heavily doped source and drain region, in said first region of said logic area, and to said P type, heavily doped region, in said second region of said logic area.

2. The method of claim 1, wherein said memory devices are stacked capacitor DRAM devices.

3. The method of claim 1, wherein said logic devices are N channel CMOS devices, and P channel CMOS devices.

4. The method of claim 1, wherein said first gate insulator layer is a thermally grown silicon dioxide layer, at thickness 40 to 60 Angstroms.

5. The method of claim 1, wherein said second gate insulator layer is a thermally grown silicon dioxide layer, at a thickness between about 50 to 70 Angstroms.

6. The method of claim 1, wherein said metal silicide layer, of said polycide gate structures residing in said second region of said logic area, in residing in said first region of said logic area, and in said memory area, is a titanium disilicide layer, deposited using R.F sputtering procedures, to a thickness between about 750 to 1250 Angstroms.

7. The method of claim 1, wherein said P type polysilicon layer, of said polycide structure, residing in said second region of said logic area, is deposited intrinsically using LPCVD procedures, to a thickness between about 800 to 1200 Angstroms, and doped via ion implantation of boron, at an energy between about 0.5 to 1.0 KeV, and at a dose between about 1E15 to 5E15 atoms/cm$^2$, resulting in said P type polysilicon layer, with a surface concentration between about 0.75 to 1.25E21 atoms/cm$^3$.

8. The method of claim 1, wherein said N type polysilicon layer, of said polycide gate structures, residing in said first region of said logic area, and residing in said memory area, is deposited intrinsically using LPCVD procedures, to a thickness between about 800 to 1200 Angstroms, and doped using a POCl$_3$ furnace procedure, resulting in said N type polysilicon layer, with a surface concentration between about 0.75 to 1.25E22 atoms/cm$^3$.

9. The method of claim 1, wherein said insulator filled shallow trenches are formed to a depth in said semiconductor substrate, between about 3000 to 5000 Angstroms, and filled with a silicon oxide layer, obtained via a HDPCVD procedure.

10. The method of claim 1, wherein said metal silicide layers, formed on the heavily doped source and drain regions, in said logic area, are comprised of titanium silicide, obtained via R.F. deposition of a titanium layer, at a thickness between about 300 to 600 Angstroms, and followed by an RTA procedure, performed at a temperature between about 300° to 600° C., converting said titanium layer to said titanium disilicide layer, in regions in which said titanium layer resided on said heavily doped source and drain regions.

11. The method of claim 1, wherein said silicon nitride spacers, formed on the sides of all polycide structures, are created via deposition of a silicon nitride layer, via LPCVD or PECVD procedures, to a thickness between about 600 to 1000 Angstroms, followed by an anisotropic RIE procedure, performed using CHF$_3$ as an etchant.

12. The method of claim 1, wherein said N type, lightly doped source and drain regions, in said first region of said logic area, and in said memory area, are formed using ion implantation of arsenic or phosphorous, at an energy between about 30 to 50 KeV, at a dose between about 1E13 to 3E13 atoms/cm$^3$, and at an implant angle between about 30° to 45°.

13. The method of claim 1, wherein said P type, lightly doped source and drain region, in said second region of said logic area, is formed using ion implantation of boron, at an energy between about 30 to 50 KeV, at a dose between about 1E13 to 3E13 atoms/cm$^2$, and at an implant angle between about 30° to 45°.

14. The method of claim 1, wherein said insulator plugs, residing between said polycide gate structures, in said logic region, are formed via deposition of an insulator layer, via LPCVD or PECVD procedures, followed by a CMP procedure.

15. The method of claim 1, wherein said polysilicon plugs, residing between said polycide gate structures, in said memory area, are formed via deposition of a doped polysilicon layer, or an intrinsic polysilicon layer, subsequently doped via ion implantation of arsenic or phosphorous, followed by a CMP procedure.

16. A method for fabricating a high performance CMOS logic region, and a low cost DRAM memory region, on the same semiconductor chip, using an integrated fabrication process, comprising the steps of:

providing a semiconductor substrate;

providing a CMOS logic region in a first region of said semiconductor substrate;

providing a DRAM memory region in a second region of said semiconductor substrate;

forming a P well region, in said semiconductor substrate, in said DRAM memory region;

forming a P well region in said semiconductor substrate, in an area of said CMOS logic region to be used for N channel MOSFET, (metal oxide semiconductor field effect transistor), devices;

forming an N well region in said semiconductor substrate, in area of said CMOS logic region to be used for P channel MOSFET devices;

forming a buried N type region, in said semiconductor substrate, in said DRAM memory region, isolating said DRAM region from said semiconductor substrate;

growing a thin silicon dioxide layer on said semiconductor substrate;

removing said thin silicon dioxide layer from said semiconductor substrate, in said CMOS logic region;

forming a CMOS logic, silicon dioxide gate insulator layer, in said CMOS logic region, from thermal oxidation of exposed, said semiconductor substrate;

forming a DRAM memory, silicon dioxide gate insulator layer, in said DRAM memory region, comprised of said thin silicon oxide layer, and comprised from silicon dioxide growth during thermal oxidation of said semiconductor substrate;

depositing an undoped polysilicon layer;

forming a composite insulator layer of silicon nitride—silicon oxide, on said undoped polysilicon layer;

forming shallow trenches in said composite insulator layer, in said undoped polysilicon layer, in silicon dioxide gate insulator layers, and in said semiconductor substrate;

forming shallow trench isolation regions, by filling said shallow trenches with a first silicon oxide layer;

removal of said composite insulator;

depositing a first silicon nitride layer on said undoped polysilicon layer;

patterning of said first silicon nitride layer, to form a masking silicon nitride shape, on a region of said undoped polysilicon layer, overlying said N well region;

performing an N type, $POCl_3$ doping procedure, to a region of said undoped polysilicon layer, not covered by said masking silicon nitride shape, to create an N type polysilicon layer;

growing a silicon dioxide layer on said N type polysilicon layer;

removal of said masking silicon nitride shape, exposing region of said undoped polysilicon layer;

converting the region of said undoped polysilicon layer, to a P type polysilicon layer, via a boron ion implantation procedure;

removal of said silicon oxide layer from the top surface of said N type polysilicon layer;

depositing a titanium nitride layer;

depositing a titanium disilicide layer;

depositing a second silicon nitride layer;

forming polycide gate structures, in said DRAM memory region, comprised of said second silicon nitride layer, said titanium disilicide layer, said titanium nitride layer, and said N type polysilicon layer, on said DRAM memory, silicon dioxide gate insulator layer;

forming a polycide gate structure, in the CMOS logic region to be used for N channel MOSFET devices, comprised of said second silicon nitride layer, said titanium disilicide layer, said titanium nitride layer, and said N type polysilicon layer, on said CMOS logic, silicon dioxide gate insulator layer;

forming a polycide gate structure, in the CMOS logic region to be used for P type MOSFET devices, comprised of said second silicon nitride layer, said titanium disilicide layer, said titanium nitride layer, and said P type polysilicon layer, on said CMOS logic, silicon dioxide gate insulator layer;

depositing a third silicon nitride layer;

anisotropic dry etching, of said third silicon nitride layer, to form silicon nitride spacers, on the sides of the polycide gate structures, in said CMOS logic region;

forming an N type, lightly doped source and drain region, in said P well region, of said CMOS logic region, under said silicon nitride spacers, using a large angle ion implantation procedure;

forming an N type, heavily doped source and drain region, in said P well region of said CMOS logic region, in an area of said P well region, not covered by said polycide gate structure, or by said silicon nitride spacers;

forming a P type, lightly doped source and drain region, in said N well region of said CMOS logic region, under said silicon nitride spacers, using a large angle ion implantation procedure;

forming a P type, heavily doped source and drain region, in said N well region of said CMOS logic region, in an area of said N well region, not covered by said polycide gate structure, or by said silicon nitride spacers;

forming titanium disilicide layers on said N type, heavily doped source and drain region, and on said P type, heavily doped source and drain regions, in said CMOS logic region;

depositing a second silicon oxide layer;

planarizing said second silicon oxide layer;

removing said second silicon oxide layer from said DRAM memory region, resulting in said silicon oxide plugs, in regions between said polycide gate structures, in said CMOS logic region;

anisotropic dry etching of said third silicon nitride layer, to form silicon nitride spacers on the sides of said polycide structures, in said DRAM memory region;

forming an N type, lightly doped source and drain region, in said P well region of said DRAM memory region, under said silicon nitride spacers, using a large angle ion implantation procedure;

depositing a doped polysilicon layer;

using a CMP procedure to form doped polysilicon plugs, in said DRAM memory region, in an area between said polysilicon gate structures;

depositing a third silicon oxide layer;

forming storage node openings in said third silicon oxide layer, exposing the top surface of said doped polysilicon plugs, in said DRAM memory region;

depositing a polysilicon storage node layer;

depositing a capacitor dielectric layer;

using a CMP procedures to remove regions of said capacitor dielectric layer, and of said polysilicon storage node layer, from the top surface of said second silicon oxide layer;

depositing a polysilicon top plate layer;

patterning of said polysilicon top plate layer, to form a stacked capacitor structure comprised of said polysilicon top plate layer, said capacitor dielectric layer, and of said polysilicon storage node layer, in said storage node openings, in said DRAM memory region;

depositing a fourth silicon oxide layer;

opening a contact hole in said fourth silicon oxide layer, to said stacked capacitor structure;

opening via holes in said fourth silicon oxide layer, in said third silicon oxide layer, and in said second silicon oxide layer, to said N type, heavily doped source and drain region, and to said P type, heavily source and drain region, in said CMOS logic region; and forming metal structures, in said contact hole, and in said via holes, contacting said stacked capacitor structure, and contacting said N type, heavily doped source and drain region, and to said P type, heavily doped source and drain region.

17. The method of claim 16, wherein said CMOS logic, silicon dioxide gate insulator layer, is thermally grown in an oxygen—steam ambient, to a thickness between about 40 to 60 Angstroms.

18. The method of claim 16, wherein said DRAM memory, silicon dioxide gate insulator layer, is thermally grown in an oxygen—steam ambient, to a thickness between about 50 to 70 Angstroms.

19. The method of claim 16, wherein said shallow trench, isolation regions are formed by creating said shallow trenches, to a depth between about 3000 to 5000 Angstroms, in said semiconductor substrate, and filled with said first silicon oxide layer, deposited via HDPCVD procedures.

20. The method of claim 16, wherein said N type polysilicon layer is formed via $POCl_3$ doping procedure, applied to said undoped polysilicon layer, resulting in the N type polysilicon layer, with a surface concentration between about 0.75 to 1.25E22 atoms/$cm^3$.

21. The method of claim 16, wherein said P type polysilicon layer is formed via a boron ion implantation procedure, at an energy between about 0.5 to 1.0 KeV, at a dose between about 1E15 to 5E15 atoms/$cm_2$, performed to said undoped polysilicon layer, resulting in a P type polysilicon layer with a surface concentration between about 0.75 to 1.25 atoms/$cm^3$.

22. The method of claim 16, wherein said silicon nitride spacers, formed on the sides of said polycide gate structures, are formed by deposition of said silicon nitride layer, via an LPCVD or PECVD procedure, to a thickness between about 600 to 1000 Angstroms, followed by an anisotropic RIE procedure, using $CHF_3$ as an etchant.

23. The method of claim 16, wherein said N type, lightly doped source and drain regions, formed in said P well region of said CMOS logic region, and in said P well region of said DRAM memory region, are formed via ion implantation of arsenic or phosphorous, at an energy between about 30 to 50 KeV, at a dose between about 1E13 to 3E13 atoms/$cm^2$, and at an implant angle between about 30° to 45°.

24. The method of claim 16, wherein said P type, lightly doped source and drain region, formed in said N well region of said CMOS logic region, is formed via ion implantation of boron, at an energy between about 0.5 to 1.0 KeV, at a dose between about 1E13 to 3E13 atoms/$cm^2$, and at an implant angle between about 30° to 45°.

* * * * *